(12) United States Patent
Shoji

(10) Patent No.: US 7,737,678 B2
(45) Date of Patent: *Jun. 15, 2010

(54) MAGNETIC SENSOR AND CURRENT SENSOR

(75) Inventor: Shigeru Shoji, Tokyo (JP)

(73) Assignee: TDK Corporation, Tokyo (JP)

(*) Notice: Subject to any disclaimer, the term of this patent is extended or adjusted under 35 U.S.C. 154(b) by 412 days.

This patent is subject to a terminal disclaimer.

(21) Appl. No.: 11/705,456

(22) Filed: Feb. 13, 2007

(65) Prior Publication Data

US 2007/0188946 A1 Aug. 16, 2007

(30) Foreign Application Priority Data

Feb. 15, 2006 (JP) ............... 2006-038587

(51) Int. Cl.
G01R 15/20 (2006.01)

(52) U.S. Cl. .................... 324/117 R

(58) Field of Classification Search .......... None
See application file for complete search history.

(56) References Cited

U.S. PATENT DOCUMENTS

| | | | |
|---|---|---|---|
| 4,749,939 A | 6/1988 | Seitz | |
| 5,561,368 A * | 10/1996 | Dovek et al. ............. | 324/252 |
| 5,751,521 A | 5/1998 | Gill | |
| 6,940,701 B2 * | 9/2005 | Oohashi et al. ......... | 360/324.12 |
| 7,075,395 B2 * | 7/2006 | Oohashi et al. ........... | 335/215 |
| 7,248,045 B2 * | 7/2007 | Shoji ....................... | 324/252 |
| 7,463,016 B2 * | 12/2008 | Shoji ....................... | 324/117 R |
| 2006/0002031 A1 | 1/2006 | Shoji | |

FOREIGN PATENT DOCUMENTS

| | | |
|---|---|---|
| JP | B2 7-123090 | 12/1995 |
| JP | A-10-105928 | 4/1998 |
| JP | A-10-293040 | 11/1998 |
| JP | A-2000-76625 | 3/2000 |
| JP | A-2006-19383 | 1/2006 |
| WO | WO 2004/072672 A1 | 8/2004 |

OTHER PUBLICATIONS

Feb. 9, 2010 Office Action issued in Japanese Application No. JP2006-038587.

* cited by examiner

*Primary Examiner*—Paresh Patel
(74) *Attorney, Agent, or Firm*—Oliff & Berridge, PLC

(57) ABSTRACT

A current sensor capable of detecting current magnetic fields generated by a current to be detected with high precision and stability while realizing a compact configuration is provided. The current sensor includes: a conductor generating a current magnetic field in accordance with supplied current to be detected; a magnetoresistive element including a free layer having a magnetization direction that varies in accordance with the current magnetic field, a pinned layer having the magnetization direction that is pinned to a direction orthogonal to the magnetization direction of the free layer under no current magnetic field, and an intermediate layer provided between the free layer and the pinned layer; and a bias applying means for applying, to the magnetoresistive element, a bias magnetic field along a direction same with the magnetization direction of the free layer under no current magnetic field.

12 Claims, 16 Drawing Sheets

MAGNETIC SENSOR AND CURRENT SENSOR

BACKGROUND OF THE INVENTION

1. Field of the Invention

The present invention relates to a magnetic sensor capable of detecting a variation of a magnetic field with high sensitivity and further to a current sensor capable of detecting a variation of a current flowing through a conductor with high sensitivity.

2. Description of the Related Art

In measuring correctly a control current which flows through a circuit of control machinery, a method that resistances are connected in series within the circuit to measure a voltage drop of the resistances is applied in general. In this case, however, a load different from the control system is given, and there is a possibility that an adverse influence may be exerted on the control system. Consequently, a method of indirectly measuring a control current by detecting the gradient of a current magnetic field generated by the control current has been used. Specifically, a control current is supplied to a curved, U-shaped conductor, and variation of current magnetic fields produced around the curved conductor is detected by use of a Hall device (for example, refer to Japanese Patent Publication No. H07-123090).

However, the above-described current sensor has problems that a miniaturization is difficult and that the linearity of detection sensitivity relative to varied magnetic fields or high-frequency response are inadequate, etc. For this reason, a current sensor, in which a giant magnetoresistive element developing a Giant Magneto-Resistive effect (hereinafter referred to as GMR element) is arranged in a current magnetic field generated by the control current in order to detect its gradient instead of the Hall element, has been proposed. That current sensor using such GMR elements can improve the detection sensitivity and high-frequency response, and what is more, detection characteristics can be made stabilized against a temperature change.

SUMMARY OF THE INVENTION

By the way, these days, a magnetic sensor or current sensor, which have a still compactor whole configuration and which are capable of detecting still weaker magnetic flux and current, are strongly required. However, in association with the miniaturization in dimension, the magnetic sensors and the current sensors, even if using the GMR elements, are susceptible to influences of an external noise (such as unnecessary magnetic field, etc.). Therefore, improvement in stability in the detection sensitivity and responsibility has become a problem to be solved. Although several attempts have been made until now such as forming the GMR elements into a shape of a long and slender strip in order to increase shape anisotropy and so on, it is yet hardly said that the performance level is fully stabilized.

The present invention has been achieved in consideration of such problems, and it is desirable to provide a magnetic sensor which is capable of detecting a magnetic field to be detected with high precision and stability while realizing a compact configuration.

It is also desirable to provide a current sensor which is capable of detecting current magnetic fields generated by a current to be detected with high precision and stability while realizing a compact configuration.

According to an embodiment of the present invention, there is provided a magnetic sensor including: a magnetoresistive element including a free layer having a magnetization direction that varies in accordance with a magnetic field to be detected, a pinned layer having a magnetization direction that is pinned to a direction orthogonal to the magnetization direction of the free layer under no magnetic field to be detected, and an intermediate layer provided between the free layer and the pinned layer; and a bias applying means for applying, to the magnetoresistive element, a bias magnetic field along a direction same with the magnetization direction of the free layer under no magnetic field to be detected.

According to an embodiment of the present invention, there is provided a first current sensor including: a conductor generating a current magnetic field in accordance with supplied current to be detected; a magnetoresistive element including a free layer having a magnetization direction that varies in accordance with the current magnetic field, a pinned layer having a magnetization direction that is pinned to a direction orthogonal to the magnetization direction of the free layer under no current magnetic field, and an intermediate layer provided between the free layer and the pinned layer; and a bias applying means for applying, to the magnetoresistive element, a bias magnetic field along a direction same with the magnetization direction of the free layer under no current magnetic field.

According to an embodiment of the present invention, there is provided a second current sensor including: a conductor generating a current magnetic field in accordance with supplied current to be detected; a first and a second magnetoresistive elements each including a free layer having a magnetization direction that varies in accordance with the current magnetic field, a pinned layer having a magnetization direction that is pinned to a direction orthogonal to the magnetization direction of the free layer under no current magnetic field, and an intermediate layer provided between the free layer and the pinned layer; a first bias applying means for applying, to the first magnetoresistive element, a bias magnetic field along a direction same with the magnetization direction of the free layer of the first magnetoresistive element under no current magnetic field; a second bias applying means for applying, to the second magnetoresistive element, a bias magnetic field along a direction same with the magnetization direction of the free layer of the second magnetoresistive element under no current magnetic field; a first and a second constant current sources supplying constant currents of a common value to the first and the second magnetoresistive elements, respectively; and a differential detector detecting a difference of voltage drops produced in the first and the second magnetoresistive elements according to each of the constant currents, wherein the current to be detected are detected based on the difference of voltage drops.

In the magnetic sensor and the first and the second current sensors of the embodiment of the present invention, a bias magnetic field, which is parallel to the magnetization direction (initial magnetization direction) of the free layer under no magnetic field (current magnetic field) to be detected, is applied to the magnetoresistive elements by bias applying means, thereby increasing the uniaxial anisotropy of the free layer even without shape anisotropy. Here, since the pinned layer has the magnetization direction pinned to a direction orthogonal to the initial magnetization direction of the free layer, a resistance change which is excellent in linearity can be developed in accordance with the magnetic field (current magnetic field) to be detected without separately applying the bias magnetic field in the direction orthogonal to the initial magnetization direction of the free layer, unlike the case where the magnetoresistive elements, in which the magnetization direction of the pinned layer and the initial magnetization direction of the free layer are parallel with each other, are provided.

In the magnetic sensor and the first and the second current sensors of the embodiment of the present invention, a permanent magnet can be used for the bias applying means, and the free layer preferably has an easy magnetization axis which is parallel to the magnetization direction of the free layer itself under no current magnetic field, and further, the flux density of the bias magnetic field is preferably within a range of $20 \times 10^{-4}$ T to $60 \times 10^{-4}$ T.

In the second current sensor of the embodiment of the present invention, one end of the first magnetoresistive element and one end of the second magnetoresistive element are connected at a first connection point, one end of the first constant current source and one end of second constant current source are connected at a second connection point, the other end of the first magnetoresistive element and the other end of the first constant current source are connected at a third connection point, the other end of the second magnetoresistive element and the other end of the second constant current source are connected at a fourth connection point, and the current to be detected is detected based on the potential difference between the third connection point and the fourth connection point produced when a voltage is applied between the first connection point and the second connection point. As well, it is preferred that the current sensor further includes a compensation current line through which a compensation current flows in accordance with the difference of voltage drops, wherein the compensation current generates a couple of compensation current magnetic fields each of which is along a direction opposite to that of each of the current magnetic fields applied to the first and the second magnetoresistive elements based on the current to be detected, and the couple of compensation current magnetic fields are applied to the first and the second magnetoresistive elements, respectively. In this case, the current to be detected is detectable based on the compensation currents flowing through the compensation current line. It is preferred that the pinned layer of one of the first and the second magnetoresistive elements has a magnetization direction of the forward direction relative to that of the current magnetic field, and the pinned layer of the other magnetoresistive element has a magnetization direction of the opposite direction to that of the current magnetic field. The "forward direction" as described above includes, in addition to a direction of complete-parallel to that of the current magnetic field, a direction within an angular range of 90 degrees relative to the complete-parallel direction (as a center line). On the other hand, the opposite direction includes, in addition to a direction that is completely antiparallel to that of the current magnetic field (that is, a completely antiparallel direction), a direction within an angular range of 90 degrees relative to the completely antiparallel direction (as a center line).

According to the magnetic sensor of the embodiment of the present invention, a magnetoresistive element is formed by layering in order a free layer having a magnetization direction that varies in accordance with a magnetic field to be detected, an intermediate layer and a pinned layer having the magnetization direction that is pinned to a direction orthogonal to the magnetization direction of the free layer under no external magnetic field; a bias magnetic field is applied to the foregoing magnetoresistive element along the magnetization direction of the free layer under no magnetic field to be detected, using a bias applying means. Accordingly, uniaxial anisotropy of the free layer can be increased more. As a result, the magnetic field to be detected can, be detected with high precision and stability without depending on the configuration of the magnetoresistive element, which is advantageous to miniaturization.

According to the first and the second current sensors of the embodiment of the present invention, a magnetoresistive element is formed by layering in order a free layer having a magnetization direction that varies in accordance with a magnetic field generated in accordance with current to be detected, an intermediate layer and a pinned layer having a magnetization direction that is pinned to a direction orthogonal to the magnetization direction of the free layer under no foregoing magnetic field; a bias magnetic field is applied to the foregoing magnetoresistive element along the magnetization direction of the free layer under no foregoing magnetic field, using the bias applying means. Accordingly, uniaxial anisotropy of the free layer can be increased more. As a result, magnetic field to be detected can be detected with high precision and stability without depending on the configuration of the magnetoresistive elements, which is advantageous to miniaturization. In particular, according to the second current sensor, the first and the second magnetoresistive elements are arranged along the conductor so as to develop an opposite-directional variation each other in accordance with the current magnetic field, so that the current to be detected can be detected based on a difference of voltage drops respectively produced when constant currents of a common value are supplied to the first and the second magnetoresistive elements. Accordingly, the current sensor allows the current magnetic field, which is generated by the current to be detected, to be detected with high precision and stability while realizing a compact configuration.

Other and further objects, features and advantages of the invention will appear more fully from the following description.

DETAILED DESCRIPTION OF THE PREFERRED EMBODIMENTS

Embodiments of the present invention will be described in detail hereinbelow with reference to the drawings.

First Embodiment

Figure 1:
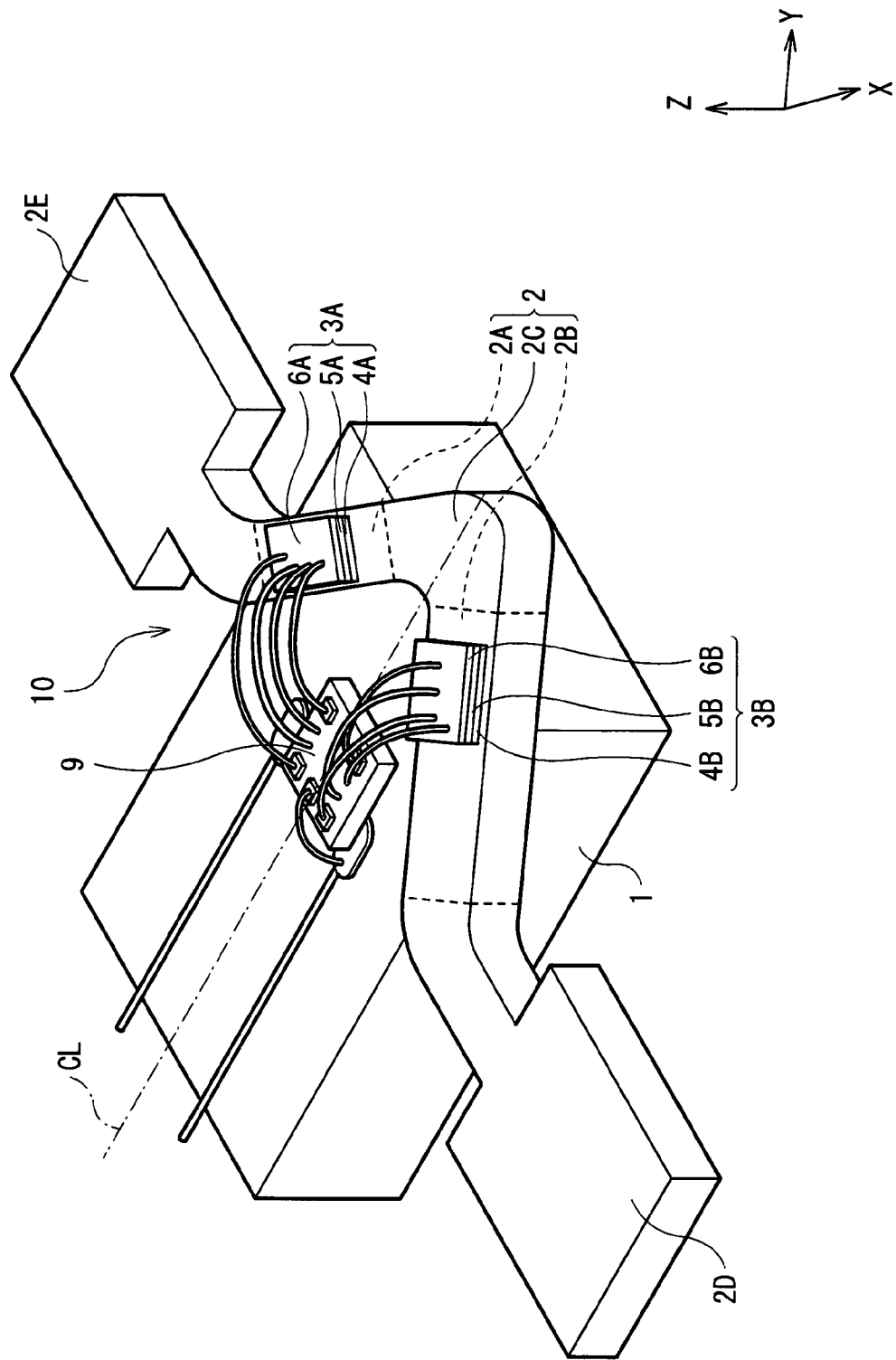
FIG. 1 is a perspective view showing a configuration of a current sensor according to a first embodiment of the present invention.
Figure 2:
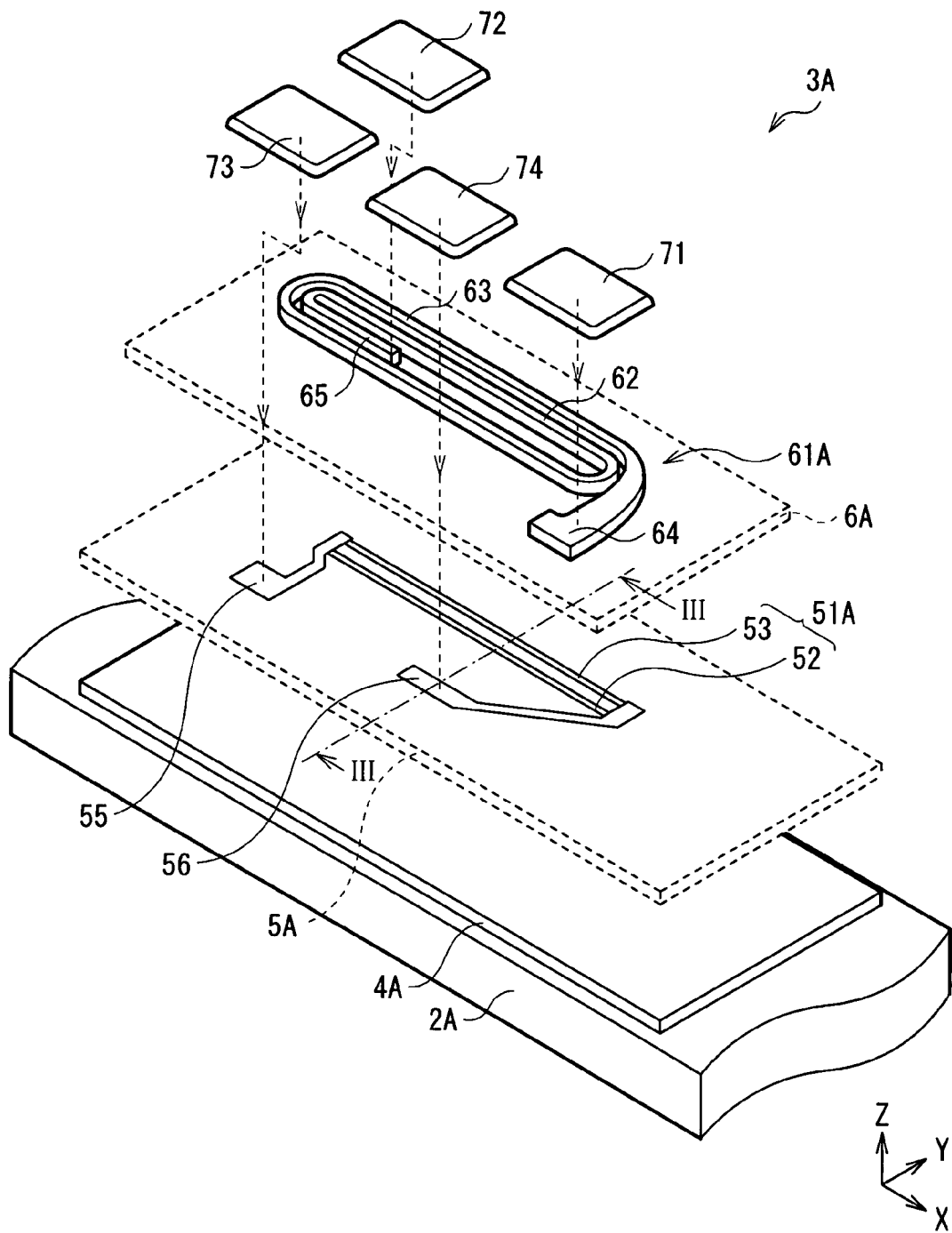
FIG. 2 is a perspective view showing an enlarged configuration of a magnetic sensor that constitutes a part of the current sensor of FIG. 1.
Figure 3:
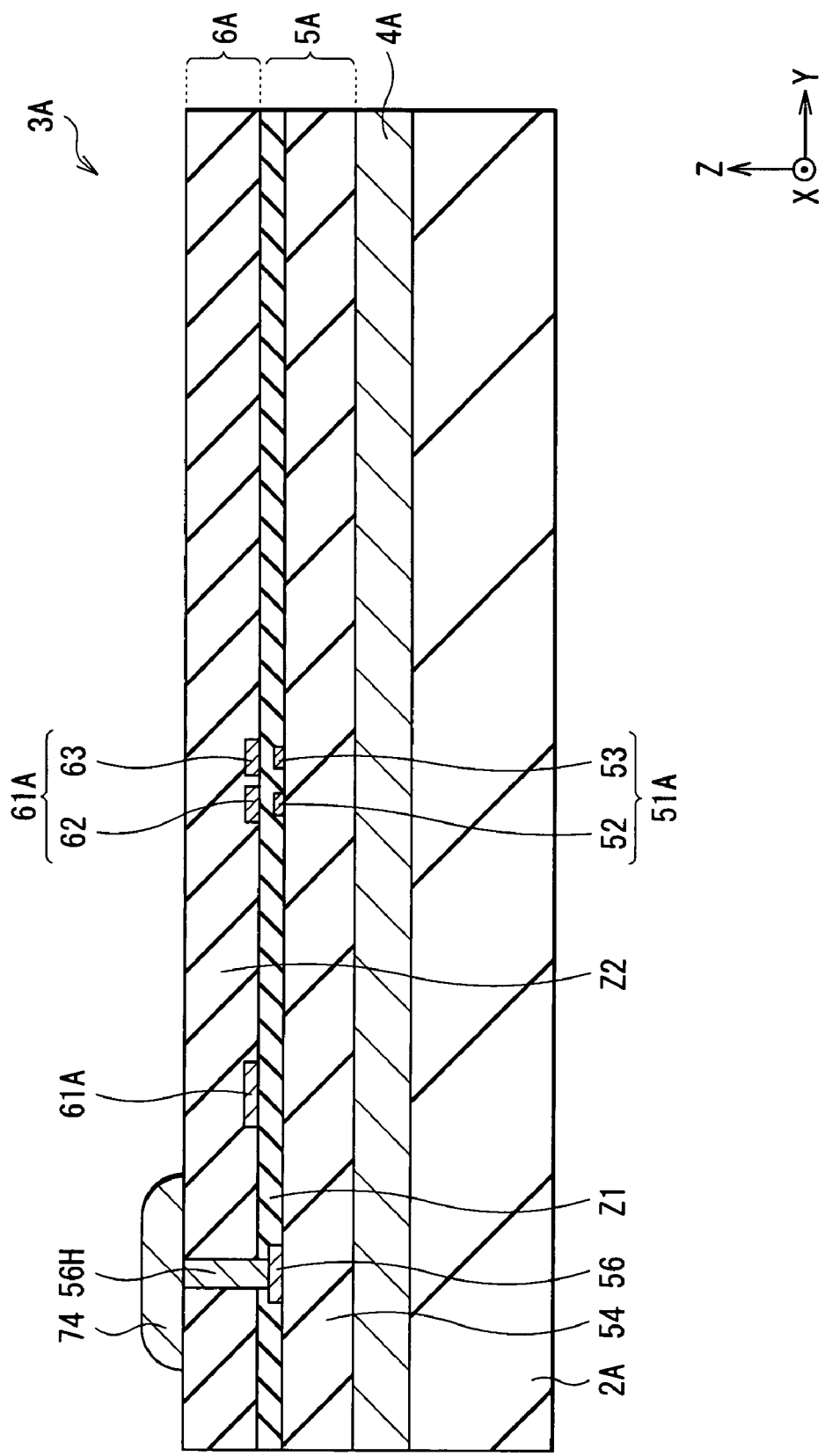
FIG. 3 is a cross section taken along line III-III of the magnetic sensor illustrated in FIG. 2.
Figure 4:
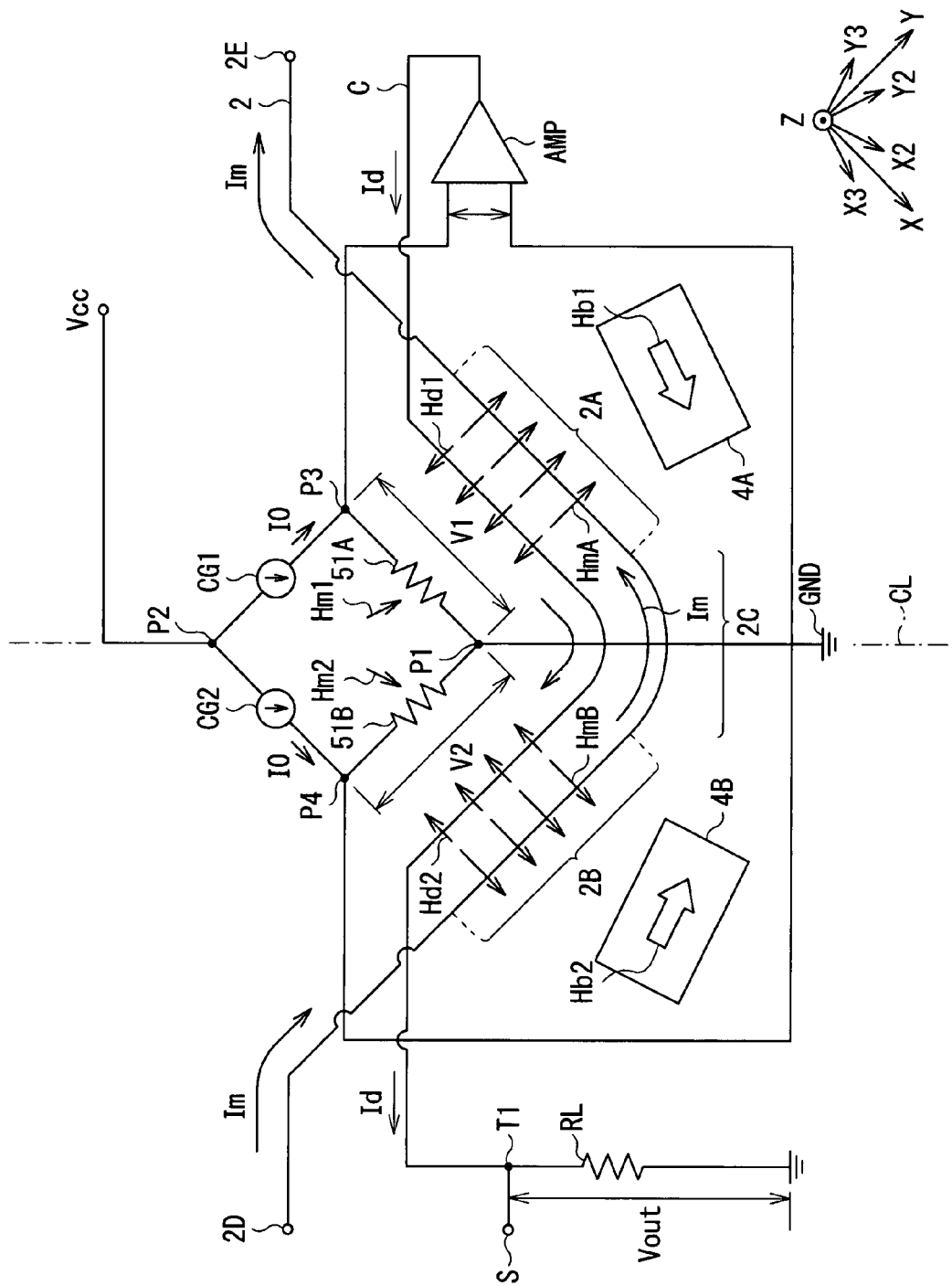
FIG. 4 is a circuit diagram corresponding to the current sensor illustrated in FIG. 1.

First, configuration of a current sensor as a first embodiment of the present invention will be described with reference to FIGS. 1 to 4. FIG. 1 is a schematic diagram showing a perspective configuration of a current sensor 10 according to the present embodiment, and FIG. 2 is an enlarged perspective view showing a magnetic sensor 3A (which will be described later), which is a part of the current sensor 10 of FIG. 1. FIG. 3 is a cross section of the magnetic sensor 3A shown in FIG. 2 taken along line III-III, seen from the direction indicated by the arrows. FIG. 4 illustrates a circuit configuration in the current sensor 10 shown in FIG. 1. Directions of all the arrows shown in FIG. 4, respectively representing a current to be detected Im, a compensation current Id, current magnetic fields Hm, compensation current magnetic fields Hd, bias magnetic fields Hb1 and Hb2, and a current I0, indicate a relative direction with respect to magnetoresistive elements (MR elements) 51A and 51B (which will be described later).

The current sensor 10 is an ammeter for measuring the current to be detected Im (FIG. 4), which is supplied to a conductor 2 provided on a substrate 1, using a pair of magnetic sensors 3A and 3B arranged on the conductor 2. The magnetic sensors 3A and 3B have MR elements 51A and 51B, respectively. One ends of the MR elements 51A and 51B are mutually connected at a first connection point P1, and arranged symmetrically with respect to a central line CL that passes through the midpoint of a virtual straight-line that connects the MR elements each other (refer to FIGS. 1 and 4).

The conductor 2 is formed of a V-shaped configuration including a pair of straight-line portions 2A and 2B that are located in a layer same as a layer orthogonal to the thickness direction (z-axis direction) and a turning portion 2C for connecting these straight-line portions 2A and 2B. The both ends of the conductor 2 are connected to pads 2D and 2E. The straight-line portions 2A and 2B are arranged axisymmetrically with respect to the central line CL (symmetry axis) in such a manner as making an angle of 45 degrees with respect to the central line CL (refer to FIGS. 1 and 4) for example, (that is, orthogonal to each other), and extending in the x-axis direction and in the y-axis direction, respectively.

Areas of the cross sections of the straight line portions 2A and 2B, which are orthogonal to the extending directions of the straight-line portions 2A (in the x-axis direction) and 2B (in the y-axis direction) respectively, are of a common area and are uniformed in their extending directions, respectively. Thereby, current magnetic field HmA is generated around the straight-line portion 2A and magnetic field HmB is generated around the straight-line portion 2B by supplying a current to be detected Im into the conductor 2 in such a manner as flowing from the pad 2D to the pad 2E for example. As a result, their synthetic magnetic fields Hm1 and Hm2 will be applied to the MR elements 51A and 51B in the directions shown by arrows respectively, as shown in FIG. 4. Here, the current magnetic field HmA is generated in the +Y direction in the straight-line portion 2A, and the current magnetic field HmB is generated in the +X direction in the straight-line portion 2B. Since the current magnetic fields HmA, HmB, although having different directions mutually, are generated by the same current to be detected Im and the areas of the cross sections of the straight-line portions 2A and 2B are uniformed and identical to each other, these current magnetic fields HmA, HmB are of a common intensity (absolute value). However, since the MR element 51A is disposed in the vicinity of the straight-line portion 2A, influence of the current magnetic fields HmB is smaller than that of the current magnetic fields HmA. For this reason, the direction of the synthetic magnetic field Hm1 applied to the MR element 51A is slightly tilted (rotated) from the +Y direction to the +X direction, that is, in a Y2 direction. Similarly, since the MR element 51B is disposed in the vicinity of the straight-line portion 2B, influence of the current magnetic fields HmA is smaller than that of the current magnetic fields HmB. For this reason, the direction of the synthetic magnetic field Hm2 applied to the MR element 51B is slightly tilted (rotated) from the +X direction to the +Y direction, that is, in an X2 direction. Furthermore, the distance from the straight-line portion 2A to the MR element 51A and the distance from the straight-line portion 2B to the MR element 51B are identical to each other, while the distance from the straight-line portion 2A to the MR element 51B and the distance from the straight-line portion 2B to the MR element 51A are identical to each other. As a result of that, the synthetic magnetic field Hm1 applied to the MR element 51A and the synthetic magnetic field Hm2 applied to the MR element 51B are of a common intensity (absolute value). Besides, the MR elements 51A and 51B are formed so that their resistances R1 and R2 (which will be described later) can develop an opposite directional variation each other by the existence of synthetic magnetic fields Hm1 and Hm2 when the current sensor 10 is driven.

The magnetic sensors 3A and 3B are stuck on the straight-line portions 2A and 2B, respectively. Specifically, the magnetic sensors 3A and 3B are formed in such a manner that magnetic substrates 4A and 4B, MR element layers 5A and 5B that including the MR elements 51A and 51B respectively, and thin film coil layers 6A and 6B including thin film coils 61A and 61B, respectively are layered in this order from the side of the straight-line portions 2A and 2B, respectively. Between the straight-line portions 2A and 2B and the magnetic substrates 4A and 4B, and between the magnetic substrates 4A and 4B and the MR element layers 5A and 5B are respectively provided with an adhesive layer of 5 μm-10 μm thickness (not illustrated) for example. Further, a plurality of electrode films 71 to 74 (refer to FIG. 2) are provided over the thin film coil layers 6A and 6B.

Details of the magnetic sensors 3A and 3B will be described. It is to be noted that the magnetic sensors 3A and 3B have the same configuration each other except for a magnetization direction J11 of a pinned layer 11 and a magnetization direction J13 of a free layer 13 (which will be described later). For this reason, the magnetic sensor 3A is typically illustrated in FIGS. 2 and 3 in order to explain its configuration. The MR element layer 5A is formed by providing, on a supporting substrate 54 made of silicon wafer or the like with a typical thickness of the order of 100 μm (refer to FIG. 3), the MR element 51A that includes two element patterns 52 and 53. The element patterns 52 and 53 have a spin valve structure by which a plurality of function films including a magnetic layer are laminated, and develop a Giant Magneto-Resistive effect (GMR). The element patterns 52 and 53 are arranged on the supporting substrate 54 in such a manner as extending in parallel with each other in the x-axis direction and being adjacent to each other in the y-axis direction that is orthogonal to the x-axis, and are mutually connected in parallel with electrode patterns 55 and 56. Herein, the electrode pattern 55 is connected to the electrode film 73 via a contact hole (not illustrated). On the other hand, the electrode pattern 56 is connected to the electrode film 74 via a contact hole 56H (refer to FIG. 3). The element patterns 52 and 53 are formed of a typical thickness of 0.8 μm by sputtering and the like. More details of the structure and operation about the element patterns 52 and 53 will be described later. The MR element layer 5B in the magnetic sensor 3B is provided with the MR element 51B instead of the MR element 51A. The MR element 51B includes the element patterns 52 and 53, which are arranged on the supporting substrate 54 in such a manner as extending in parallel with each other in the y-axis direction and being adjacent to each other in the x-axis direction.

The thin film coil 61A is a thin film pattern formed in such a manner as winding within the film surface (within the XY plane) of the thin film coil layer 6A and includes winding body portions 62 and 63 extending in the x-axis direction so as to correspond to the element patterns 52 and 53, respectively. The thin film coil 61A is essentially made of a metal material of high conductivity, such as copper (Cu), to which the below-mentioned compensation current Id is supplied. One end 64 of the thin film coil 61A is connected to the electrode film 71 via a contact hole (not illustrated) and the other end 65 thereof is connected to the electrode film 72 via a contact hole (not illustrated). Herein, the magnetic sensor 3A is formed in such a manner that the compensation current Id flows from the end 64 to the other end 65. The MR element 51A and the thin film coil 61A are covered with insulating films Z1 and Z2, respectively, which are made of aluminum oxide ($Al_2O_3$) or the like as shown in FIG. 3 so that they are electrically insulated each other. The electrode films 71 to 74 are provided on the insulating film Z2, respectively. The thin film coil layer 6B in the magnetic sensor 3B includes a thin film coil 61B instead of the thin film coil 61A. The thin film coil 61B winds within the XY plane while including the winding body portions 62 and 63 that extend in the y-axis direction so as to correspond to the element patterns 52 and 53 of the MR element 51B.

The magnetic substrates 4A and 4B are typically made of a barium strontium ferrite [(Ba—Sr) $Fe_2O_4$] with a typical thickness of 75 μm to 95 μm. It is to be noted that the component material for the magnetic substrates 4A and 4B is not limited to that, but other ferromagnetic materials capable of becoming a permanent magnet can also be used. The magnetic substrates 4A and 4B have a function of applying bias magnetic fields Hb1 and Hb2 (refer to FIG. 4) to the MR elements 51A and 51B, respectively. The flux density of each of the bias magnetic fields Hb1 and Hb2 is preferably within a range of $20\times10^{-4}$ T to $60\times10^{-4}$ T, and especially within a range of $30\times10^{-4}$ T to $60\times10^{-4}$ T. Herein, it is preferred that the magnetic substrates 4A and 4B have a bigger area than the MR elements 51A and 51B on the XY plane in order to apply more stabilized bias magnetic fields Hb1 and Hb2. The direction of the bias magnetic field Hb1 is of an X3 direction (direction tilted slightly from the +X direction to the −Y direction) which intersects perpendicularly with the Y2-direction, and the direction of the bias magnetic field Hb2 is of a Y3 direction (direction tilted slightly from the +Y direction to the −X direction) which intersects perpendicularly with the X2 direction. It is to be noted that the directions of the bias magnetic fields Hb1 and Hb2 are determined not only with reference to the synthetic magnetic fields Hm1 and Hm2 but also with reference to the magnetization directions of each pinned layer 11 (which will be described later) of the MR elements 51A and 51B.

The current sensor 10 further includes a constant current source CG1 (a first constant current source) and a constant current source CG2 (a second constant current source) whose ends are connected each other at a second connection point P2 (FIG. 4). The constant current source CG1 is connected to one end of the MR element 51A which is opposite to the first connection point P1 at a third connection point P3, and the constant current source CG2 is connected to one end of the MR element 51B which is opposite to the first connection point P1 at a fourth connection point P4. Namely, the MR element 51A and the constant current source CG1 are connected in series, and the MR element 51B and the constant current source CG2 are connected in series, while both of these series-connections are connected in parallel each other axisymmetrically with respect to the central line CL (symmetry axis). Here, the constant current source CG1 and the constant current source CG2 supply a constant current I0 of a common value to the MR element 51A and the MR element 51B, respectively. It is to be noted that the constant current sources CG1 and CG2 are disposed in the inside of a circuit board 9 provided on the substrate 1 (not illustrated in FIG. 1).

The current sensor 10 is provided with one compensation current line C which includes a portion to which the thin film coil 61A and the thin film coil 61B are connected in series. When voltage is applied between the first connection point P1 and the second connection point P2, a compensation current Id, which is based on the potential difference between the third connection point P3 and the fourth connection point P4, is supplied to the compensation current line C (FIG. 4). One end of the compensation current line C is connected the output side of a differential amplifier AMP as a difference detector whose input side is connected to the third and fourth connection points P3, P4, and the other end of the compensation current line C is grounded via a resistor RL. A compensation current detection means S is connected to the resistor RL at a connection point T1 on the differential amplifier AMP side. Here, when the compensation current Id flows through the compensation current line C, a compensation current magnetic field Hd1 having an opposite direction to that of the current magnetic field Hm1 is generated in the winding body portions 62 and 63 of the thin film coil 61A, and a compensation current magnetic field Hd2 having an opposite direction to that of the current magnetic field Hm2 is generated in the winding body portions 62 and 63 of the thin film coil 61B. Namely, the compensation current magnetic field Hd1 is generated in the −Y direction, while the compensation current magnetic field Hd2 is generated in the −X direction, thereby having an effect of canceling the current magnetic fields Hm1 and Hm2, respectively.

Figure 5A:
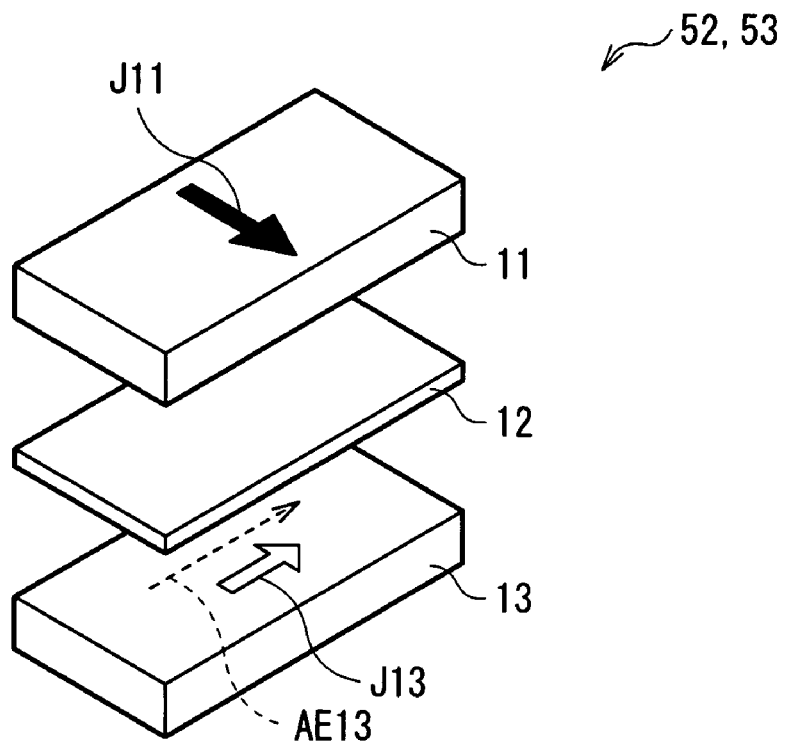
FIGS. 5A and 5B are exploded perspective views showing a configuration of a magnetoresistive element as a main part of the magnetic sensor illustrated in FIG. 2.
Figure 5B:
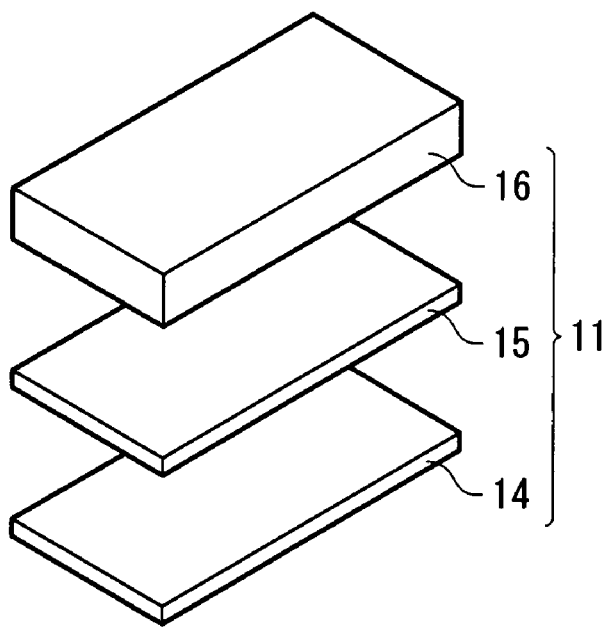

Next, configurations of the element patterns 52 and 53 will be described more specifically with refer to FIGS. 5A and 5B. FIG. 5A is an exploded perspective view disassembling and showing the configuration of the element patterns 52 and 53. However, the ratio of the dimension is not necessarily equivalent to the actual one.

As shown in FIG. 5A, the element patterns 52 and 53 is configured in such a manner that a pinned layer 11 having a magnetization direction J11 that is pinned to a certain direction, an intermediate layer 12 exhibiting no specific magnetization directions, and a free layer 13 having a magnetization direction J13 whose direction varies according to external magnetic fields H such as the synthetic magnetic fields Hm1 and Hm2 are layered in order. It is to be noted that FIG. 5A shows an unloaded state (namely, the state where the external magnetic field H is zero) in which the synthetic magnetic fields Hm1 and Hm2 are zero (Hm1 and Hm2=0), and the bias magnetic fields Hb1 and Hb2 generated by the magnetic substrates 4A and 4B are not applied. In this case, the magnetization direction J13 of the free layer 13 is in parallel with its own easy magnetization direction AE13, while it is orthogonal to the magnetization direction J11 of the pinned layer 11. The configuration of the pinned layer 11 is illustrated in detail in FIG. 5B. The pinned layer 11 is configured in such a manner that a magnetization pinning film 14, an antiferromagnetic film 15 and a protective film 16 are layered in order from the intermediate layer 12 side. The magnetization pinning film 14 is essentially made of a ferromagnetic material such as cobalt (Co) or cobalt iron alloy (CoFe). The magnetization direction of the magnetization pinning film 14 becomes the magnetization direction J11 of the pinned layer 11 as a whole. On the other hand, the antiferromagnetic film 15 is essentially made of an antiferromagnetic material such as platinum manganese alloy (PtMn) or iridium manganese alloy (IrMn). The antiferromagnetic film 15 is in a state where the spin magnetic moment in one direction and the spin magnetic moment in another direction opposite to the one direction are completely cancelled out each other, thereby having a function to fix the magnetization direction of the magnetization pinning film 14. The protective film 16 is essentially made of a chemically-stabilized nonmagnetic substance such as tantalum (Ta), hafnium (Hf) etc. with a function to protect the magnetization pinning film 14 and the antiferromagnetic film 15 etc.

The free layer 13 is made of a soft magnetic material such as nickel iron alloy (NiFe). The intermediate layer 12 is made of copper (Cu) and its top face is in contact with the pinned layer 11 and its under face is in contact with the free layer 13. The intermediate layer 12 may be made of, besides copper, a nonmagnetic metal having high conductivity such as gold (Au). The top face of the pinned layer 11 (the side opposite to the intermediate layer 12) and the under face of the free layer 13 (the side opposite to the intermediate layer 12) are protected with a protective film (not illustrated), respectively. An exchange bias magnetic field Hin in the magnetization direction J11 is generated between the pinned layer 11 and the free layer 13, working on each other via the intermediate layer 12. Intensity of the exchange bias magnetic field Hin varies as the spin direction in the free layer 13 rotates according to the interval between the pinned layer 11 and the free layer 13 (that is, the thickness of the intermediate layer 12). Therefore, the exchange bias magnetic field Hin can be seemingly made into zero. Although FIGS. 5A and 5B show an example of configuration in which the free layer 13, the intermediate layer 12, and the pinned layer 11 are layered in order from bottom up, it is not limited to the example but may be made in such a manner as layering in the opposite order.

In the element patterns 52 and 53 having the above-mentioned configuration, the magnetization direction J13 of the free layer 13 rotates by applying the synthetic magnetic fields Hm1 and Hm2, thereby changing the relative angle of the magnetization direction J13 and the magnetization direction J11. The relative angle is determined by magnitudes and directions of the synthetic magnetic fields Hm1 and Hm2.

Figure 6A:
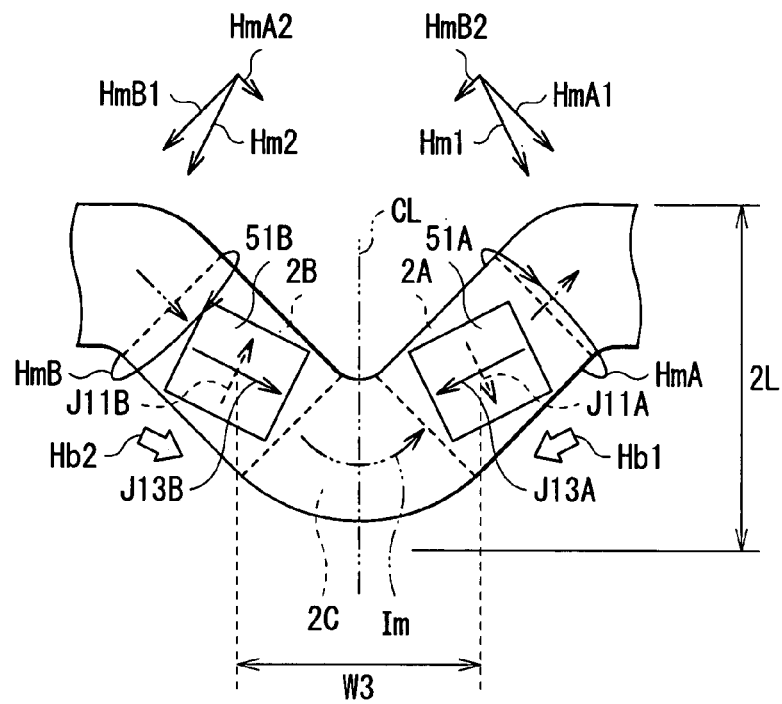
FIGS. 6A and 6B are conceptual diagrams for explaining a state of magnetization directions, current magnetic fields and bias magnetic fields in the current sensor of FIG. 1.
Figure 6B:
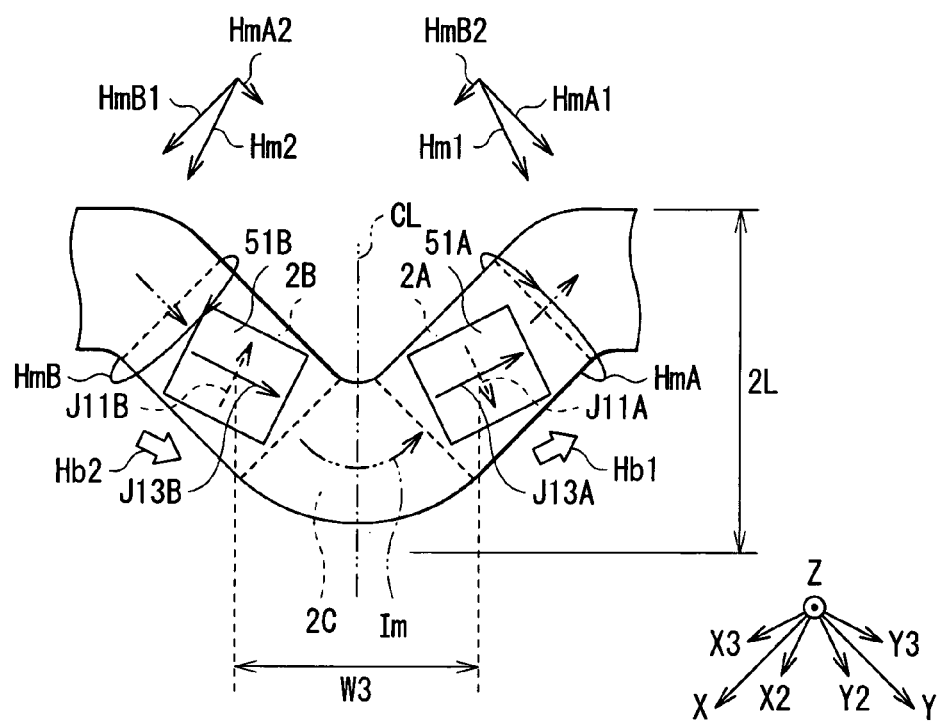

A relation of the magnetization directions J11 and J13 of the element patterns 52 and 53 of the MR elements 51A and 51B, the bias magnetic fields Hb1 and Hb2, and the synthetic magnetic fields Hm1 and Hm2 will be explained herein with reference to FIGS. 6A and 6B. FIGS. 6A and 6B are conceptual diagrams indicating a relation between the current direction, the magnetic field direction, and the magnetization direction in the current sensor 10. Since both of the element patterns 52 and 53 exhibit the same behavior, they are collectively denoted as the MR element 51A or MR element 51B in FIGS. 6A and 6B. Herein, when a current to be detected Im flows in the extending direction of the conductor 2 as shown by arrows, the current magnetic field HmA is generated around the straight-line portion 2A, and the current magnetic field HmB is generated around the straight-line portion 2B. In this case, the synthetic magnetic field Hm1 applying to the MR element 51A is a resultant force between a magnetic field component HmA1 in the +Y direction caused by the current magnetic field HmA and a magnetic field component HmB2 in the +X direction caused by the current magnetic field HmB, as shown by vectors. On the other hand, the synthetic magnetic field Hm2 applying to the MR element 51B is a resultant force between a magnetic field component HmA2 in the +Y direction caused by the current magnetic field HmA and a magnetic field component HmB1 in the +X direction caused by the current magnetic field HmB, as shown by vectors. In the MR elements 51A and 51B, magnetization directions J11A and J11B of the pinned layers 11 are pinned in the direction parallel or antiparallel with the synthetic magnetic fields Hm1 and Hm2, respectively. Namely, the magnetization direction J11A is in the forward direction relative to the direction of the current magnetic field HmA, and the magnetic field direction J11B is in the opposite direction to the direction of the current magnetic field HmB. Under no external magnetic field H, magnetization directions J13A and J13B of the free layers 13 are in a state orthogonal to the synthetic magnetic fields Hm1 and Hm2, respectively. Namely, under no external magnetic field H, the magnetization directions J13A and J13B are in a state orthogonal to the magnetization directions J11A and J11B, respectively. Therefore, when the current to be detected Im is supplied to the conductor 2 and the synthetic magnetic fields Hm1 and Hm2 are generated consequently, the magnetization directions J13A and J13B are coming to be in parallel (low resistance), or antiparallel (high resistance) to the magnetization directions J11A and J11B, more and more. The MR element 51A and the MR element 51B are set up so that their own resistances R1 and R2 may make an opposite-directional change each other according to the synthetic magnetic fields Hm1 and Hm2. Specifically, as shown in FIG. 6A, the MR element 51A has the magnetization direction J11A in the +Y2 direction and the magnetization direction J13A in the +X3 direction under no external magnetic field H, for example. On the other hand, the MR element 51B has the magnetization direction J11B in the −X2 direction and the magnetization direction J13B in the +Y3 direction under no external magnetic field H. In this case, when the current to be detected Im flows in the direction of the arrow to generate the synthetic magnetic fields Hm1 and Hm2, the magnetization direction J13A rotates counterclockwise (on the drawing sheet) to be in parallel with the magnetization direction J11A while the magnetization direction J13B rotates clockwise (on the drawing sheet) to be in antiparallel with the magnetization direction J11B. As a result, the resistance R1 of the MR element 51A decreases while the resistance R2 of the MR element 51B increases. Or as shown in FIG. 6B, the MR element 51A may have the magnetization direction J11A in the +Y2 direction and the magnetization direction J13A in the −X3 direction under no external magnetic field H, while the MR element 51B may have the magnetization direction J11B in the −X2 direction and the magnetization direction J13B in the +Y3 direction under no external magnetic field H. In this case, when current to be detected Im flow in the direction of arrows to generate the synthetic magnetic fields Hm1 and Hm2, the magnetization direction J13A is rotated clockwise to be in a state parallel to the magnetization direction J11A, while the magnetization direction J13B is rotated clockwise to be in a state of antiparallel to the magnetization direction J11B. As a result, the resistance R1 of the MR element 51A decreases and the resistance R2 of the MR element 51B increases as well. In both of FIGS. 6A and 6B, the resistance R1 of the MR element 51A decreases and the resistance R2 of the MR element 51B increases, but it is not limited to that, and it is also possible to have such a configuration that the resistance R1 increases and the resistance R2 decreases.

In both of FIG. 6A and FIG. 6B, it is to be noted that the magnetic substrates 4A and 4B are set up so as to apply bias magnetic fields Hb1 and Hb2 having the same direction as the magnetization directions J13A and J13B, respectively under no external magnetic field H. Therefore, the bias magnetic fields Hb1 and Hb2, as an anisotropic magnetic field, strengthen the uniaxial anisotropy of the free layer 13 to contribute to stabilization of the magnetic field detecting operation in the MR elements 51A and 51B.

In the current sensor 10 with such a configuration, compensation currents Id based on a potential difference V0 (difference of the voltage drops produced in each of the MR elements 51A and 51B) between the third connection point P3 and the fourth connection point P4, which is generated when voltage is applied between the first connection point P1 and the second connection point P2, flows through the compensation current line C via the differential amplifier AMP and the compensation current Id is detected by the compensation current detection means S. The differential amplifier AMP has a function of adjusting the compensation currents Id so that a value of the difference V0 may become zero.

A method of measuring the current magnetic field Hm generated by the current to be detected Im will be explained hereinafter with reference to FIG. 4.

In FIG. 4, constant currents from the constant current sources CG1 and CG2 at the time of applying a predetermined voltage between the first connection point P1 and the second connection point P2 are indicated as I0, and the resistances of the MR elements 51A and 51B are indicated as R1 and R2, respectively. When the current magnetic field Hm is not applied, a potential V1 at the third connection point P3 is expressed as follows:

$$V1 = I0 \times R1$$

and a potential V2 at the fourth connection point P4 is expressed as follows:

$$V2 = I0 \times R2$$

Therefore, the potential difference between the third and fourth connection points P3 and P4 is expressed by the following Equation.

$$\begin{aligned} V0 &= V1 - V2 \\ &= I0 \times R1 - I0 \times R2 \\ &= I0 \times (R1 - R2) \end{aligned} \quad (1)$$

In this circuit, the amount of resistance variation can be obtained by measuring the potential difference V0 when the current magnetic field Hm is applied. For example, when the current magnetic field Hm is applied, letting the resistance R1 and R2 increase by variation amounts ΔR1 and ΔR2 respectively, the Equation (1) is rewritten as follows:

$$\begin{aligned} V0 &= V1 - V2 \\ &= I0 \times (R1 - R2) \\ &= I0 \times \{(R1 + \Delta R1) - (R2 + \Delta R2)\} \end{aligned} \quad (2)$$

As already stated, since the MR elements 51A and 51B are arranged so that the resistances R1 and R2 show an opposite directional variation each other caused by the current magnetic fields Hm, the variation amounts ΔR1 and ΔR2 have an opposite positive/negative sign each other. Therefore, as shown in Equation (2), influence of the variation amounts ΔR1 and ΔR2 greatly appears in the value of the potential difference V0 produced by application of the current magnetic field Hm.

Suppose that both of the MR elements 51A and 51B have completely identical characteristics each other, that is, letting R1=R2=R and

ΔR1=−ΔR2=ΔR,

Equation (2) is re-expressed as follows:

$$\begin{aligned} V0 &= I0 \times (R + \Delta R - R + \Delta R) \\ &= I0 \times (2 \times \Delta R) \end{aligned} \quad (3)$$

Therefore, if the MR elements 51A and 51B where the relation between external magnetic fields and the resistance variation amounts is already known are employed, intensity of the current magnetic fields Hm can be measured and magnitude of current to be detected Im generating the current magnetic fields Hm can be estimated thereby. In this case, since sensing is performed using two MR elements (the MR elements 51A and 51B), twice as much resistance variation can be obtained as compared with a case where sensing is performed using either one of the MR elements 51A or 51B, thereby more accurate measurement value is advantageously available. On the other hand, since discrepancies in the characteristics of MR elements and in the connection resistances, etc. can be restrained compared with a case where sensing is performed by way of configuring a bridge circuit including four MR elements, balance adjustment is made easy even if an MR element with high sensitivity is employed. In addition, since the number of the MR elements itself can be reduced and thereby the number of terminals is also reduced, space-saving can be advantageously realized.

In the current sensor 10, a potential V1 detected at the third connection point P3 and a potential V2 detected at the fourth connection point P4 are supplied to the differential amplifier AMP, and the compensation current Id that makes a value of difference (potential difference V0) into zero is outputted. The compensation current Id from the differential amplifier AMP produces a compensation current magnetic field Hd having a direction opposite to the current magnetic field Hm by flowing near the MR elements 51A and 51B in the direction opposite to the current to be detected Im, thereby canceling errors resulting from dispersion in the connection resistances in the circuit, discrepancies in the mutual characteristics between the MR elements 51A and 51B, deviation of temperature distribution, or disturbance magnetic fields applied from the outside, etc. As a result, it is possible to get closer to a intensity which is proportional only to the current magnetic field Hm. Therefore, by measuring an output voltage Vout and calculating the value of the compensation current Id in view of the relation with the known resistor RL at the compensation current detection means S, the value of the current magnetic field Hm can be calculated with more precision and the magnitude of the current Im to be detected can be estimated with high precision as a result.

According to the current sensor 10 of the present invention, as described above, the magnetic substrates 4A and 4B are set up in such a manner as applying the bias magnetic fields Hb1 and Hb2, which have the same direction with the magnetization directions J13A and J13B, respectively under no external magnetic field H, to the MR elements 51A and 51B. In this manner, uniaxial anisotropy of the free layer 13 can be sufficiently increased so as to fully attain the stabilization of magnetic field detecting operation in the MR elements 51A and 51B. In the past, shape anisotropy has been increased by developing the shape of the MR element itself long and slender, thereby resistance change ratio has been raised and further a plurality of MR elements are arranged parallel with a predetermined spaces to suppress heat generation. However, that requires a comparatively large space and what is more, that has become a cause of excessively-enlarged compensation current line. As compared with this, since the current sensor 10 of the present embodiment need not depend on shape anisotropy so much, configuration of the element patterns 52 and 53 in the MR elements 51A and 51B can be determined with more flexibility. Although the two element patterns 52 and 53 are respectively formed of a thin strip shape here, it is also possible to form each of them into a configuration closer to a square. Even more, it is not always necessary to use two or more element patterns. According to the present embodiment, although each of the MR elements 51A and 51B includes two element patterns 52 and 53, they (the element patterns 52 and 53) may be combined into one so that more compact configuration can be realized.

Further, the magnetic substrates 4A and 4B and the MR element layers 5A and 5B respectively including the MR elements 51A and 51B are formed in this order on the straight-line portions 2A and 2B of the conductor 2 that is used as a path of the current to be detected Im so that the magnetic substrates 4A and 4B may apply the bias magnetic fields Hb1 and Hb2. As a result, sufficient stabilization in the detecting operation can be attained while using a space more effectively, compared with a case where permanent magnets or coils are arranged on both sides of the MR elements. Namely, since the magnetic substrates 4A and 4B can be arranged in a nearer position to each of the MR elements 51A and 51B, even with a relatively small dimension made of the same component materials, the bias magnetic fields Hb1 and Hb2 can be secured sufficiently for stable detecting operation. What is more, in addition to the advantage that bulk formation can be made easier because of its simple configuration, even if the directions of the magnetization directions J11A and J11B in the MR elements 51A and 51B are different from each other, the bias magnetic fields Hb1 and Hb2 can be easily applied to a suitable direction respectively corresponding to each of them.

Further, since the V-shaped conductor 2 including the straight-line portions 2A and 2B that are orthogonal to each other is employed, a more compact whole configuration can be realized compared with a case where the U-shaped conductor including a pair of parallel straight-line portions is used.

Thus, according to the current sensor 10 of the present embodiment, measurement of the current to be detected Im can be performed with high precision and full stability while realizing a more compact configuration.

In particular, the present invention further has the compensation current line C to which the compensation current Id is supplied based on a difference V0 (difference of the voltage drops produced in each of the MR elements 51A and 51B) between the potential V1 detected at the third connection point P3 and the potential V2 detected at the fourth connection point P4, thereby applying via the thin film coils 61A and 61B the compensation current magnetic fields Hd1, Hd2 of a direction opposite to the current magnetic fields Hm1 and Hm2 to the MR elements 51A and 51B, respectively. As a result, changes of the output voltage Vout caused by the discrepancies of characteristics between the MR elements 51A and 51B, dispersion of the connection resistances in the circuit, temperature distribution and the like can be cancelled, thereby detection of the current magnetic fields Hm can be attained with higher sensitivity and higher precision.

In addition, in the current sensor 10, the MR elements 51A and 51B, the constant current sources CG1 and CG2, and the compensation current line C are provided in such a manner as to be axisymmetrically arranged with respect to the central line CL, while the pair of straight-line portions 2A and 2B are arranged on the XY plane axisymmetrically with respect to the central line CL. In this manner, the temperature distribution thereof can become symmetrical with respect to the central line CL. Accordingly, the zero point drift depending on the temperature distribution is suppressed.

Second Embodiment

Next will be explained a current sensor as a second embodiment according to the present invention. Although in the foregoing first embodiment is explained the case in which the conductor 2 of V-shaped configuration (in plan view) is used, in the present embodiment is explained a case where a straight-line shaped conductor 21 is employed.

The current sensor of the second embodiment has the same configuration as that of the above-mentioned first embodiment substantially except for the conductor 21. Namely, the current sensor of the second embodiment has the structure in which the magnetic substrates 4A and 4B, the MR element layers 5A and 5B including the MR elements 51A and 51B, and the thin film coil layers 6A and 6B are layered in this order on the straight-line-shaped conductor 21 used as a path of the current to be detected Im. Therefore, here is explained a relation of the magnetization directions J11 and J13 of the MR elements 51A and 51B (specifically the element patterns 52 and 53 therein), the bias magnetic field Hb, and the current magnetic field Hm with reference to FIGS. 7A and 7B. FIGS.

Figure 7A:
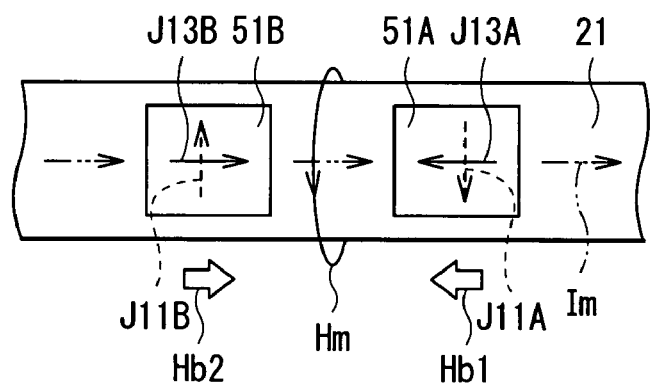
FIGS. 7A and 7B are conceptual diagrams for explaining a state of magnetization directions, current magnetic fields and bias magnetic fields in a current sensor according to a second embodiment of the present invention.
Figure 7B:
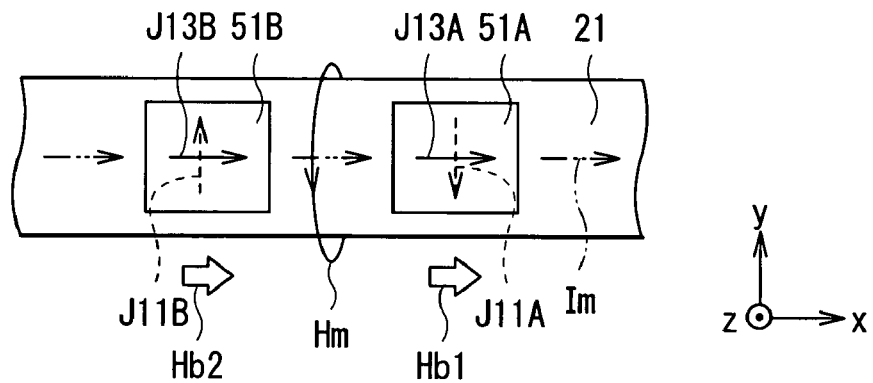

7A and 7B are conceptual diagrams illustrating the relation of the current direction, the magnetic field direction and the magnetization direction according to the current sensor of the present embodiment. Here, a current to be detected Im flows in and along the extending direction of the conductor 21, and the magnetization directions J11 of the pinned layers 11 are pinned in the direction of antiparallel to each other. On the other hand, the magnetization directions J13 of the free layers 13 are either parallel or antiparallel to the flowing direction of the current to be detected Im under no external magnetic field H. Namely, under no external magnetic field H, the magnetization directions J13 of the free layers 13 are orthogonal to the magnetization directions J11 of the pinned layers 11. Therefore, when the current magnetic fields Hm is generated, the magnetization directions J13 gets closer to be in parallel (low resistance) or antiparallel (high resistance) with respect to the magnetization directions J11. Here, the MR element 51A and MR element 51B are set up so that their resistances R1 and R2 develop an opposite-directional variation each other according to the current magnetic field Hm. Specifically, as shown in FIG. 7A, the MR element 51A has the magnetization direction J11A in the −y direction and the magnetization direction J13A in the −x direction under no external magnetic field H for example. On the other hand, the MR element 51B has the magnetization direction J11B in the +y direction and the magnetization direction J13B in the +x direction under no external magnetic field H. In this case, when the current to be detected Im flows in the direction as indicated by arrows to generate the current magnetic field Hm, the magnetization direction J13A is rotated counterclockwise (on the drawing sheet) to get to be in parallel to the magnetization direction J11A, while the magnetization direction J13B is rotated clockwise (on the drawing sheet) to get to be in antiparallel to the magnetization directions J11B. Or as shown in FIG. 7B, the magnetization direction J11A may be in the −y direction and the magnetization direction J13A under no external magnetic field H may be in the direction of +x in the MR element 51A, while the magnetization direction J11B may be in the +y direction and the magnetization direction J13B under no external magnetic field H may be in the +x direction in the MR element 51B. In this case, when current to be detected Im flows in the direction indicated by arrows to generate the current magnetic field Hm, the magnetization direction J13A is rotated clockwise to get to be in parallel to the magnetization direction J11A, while the magnetization direction J13B is rotated clockwise to get to be in antiparallel to the magnetization direction J11B.

In any case, the bias magnetic fields Hb1 and Hb2 are set up so as to be in the same direction with the magnetization directions J13A and J13B under no external magnetic field H respectively. Therefore, the bias magnetic fields Hb1 and Hb2 increase the uniaxial anisotropy of the free layers 13 as corresponding to an anisotropic magnetic field, thereby contributing to stabilization of the magnetic field detecting operation in the MR elements 51A and 51B. In particular, since the current sensor of the present embodiment employ the straight-line conductor 21, the current magnetic field Hm of a generally uniformed quality can be generated without producing an unfavorable interaction like in the case of the U-shaped or V-shaped conductors. For this reason, the current magnetic field Hm applies efficiently to the MR elements 51A and 51B, and current measurement can be made with higher precision. If the magnetization directions J11A and J11B are arranged so as to be orthogonal to the flowing direction of the current to be detected Im (namely, the extending direction of the conductor 21), the highest sensitivity measurement can be attained. Accordingly, when the V-shaped conductor 2 is used (the first embodiment), the magnetic sensors 3A and 3B are leaned along to the extending directions of the conductor 2 but such arrangement is not necessary in the second embodiment, therefore allowing the magnetic sensors 3A and 3B to be installed simply.

Further, in the current sensor of the present embodiment, since the conductor 21 has a straight-line configuration, two-dimensional broadening can be restrained compared with the above-mentioned first embodiment using the V-shaped conductor 2, the whole configuration can be made more compact. However, since the magnetization direction J11A and the magnetization direction J11B are in antiparallel mutually as is clear from FIGS. 7A and 7B, the interval between the MR element 51A and the MR element 51B needs to be larger than the interval W3 shown in FIGS. 6A and 6B in order to avoid unfavorable interaction of the bias magnetic field Hb1 and the bias magnetic field Hb2.

As explained above, since the current sensor of present embodiment is formed in such a manner as layering the magnetic substrates 4A and 4B and the MR element layers 5A and 5B including the MR elements 51A and 51B respectively in this order on the straight-line conductor 21 that is used as path of the current to be detected Im, so that the magnetic substrates 4A and 4B may apply the bias magnetic fields Hb1 and Hb2, which respectively have the same direction with the magnetization directions J13A and J13B under no external magnetic field H, to the MR elements 51A and 51B. In this manner, uniaxial anisotropy of the free layer 13 is increased and the stabilization of magnetic field detecting operation can be sufficiently obtained in the MR elements 51A and 51B. In particular, employment of the straight-line conductor 21 makes it possible to reduce the mutual interval between the MR elements 51A and 51B compared with a case of a U-shaped conductor while keeping the dimensions of the MR elements 51A and 51B as it is. Further, since the straight-line conductor has no turning portion like the U-shaped conductor, the dimension of the conductor 21 can be more compact. Therefore, more compact whole configuration can be realized while keeping the dimensions of the original MR elements 51A and 51B. What is more, the error of measurement based on temperature difference between the MR elements 51A and 51B can be reduced, and current measurement stabilized with sufficient precision can be realized.

Third Embodiment

Next will be explained a current sensor as a third embodiment according to the third invention. In the first embodiment as described above, the magnetic substrate 4A and the MR element layer 5A including the MR element 51A are disposed on the straight line portion 2A of the conductor 2, and the magnetic substrate 4B and the MR element layer 5B including the MR element 51B are disposed on the straight line portion 2B. In the third embodiment, on the other hand, four MR elements 51A to 51D are disposed on one conductor 2. Explanation will be made hereinbelow with reference to FIG. 8. Since its configuration is substantially similar to that of the above-mentioned first embodiment except for the point that the four MR elements 51A to 51D are disposed, descriptions will be omitted suitably according to circumstances.

Figure 8:
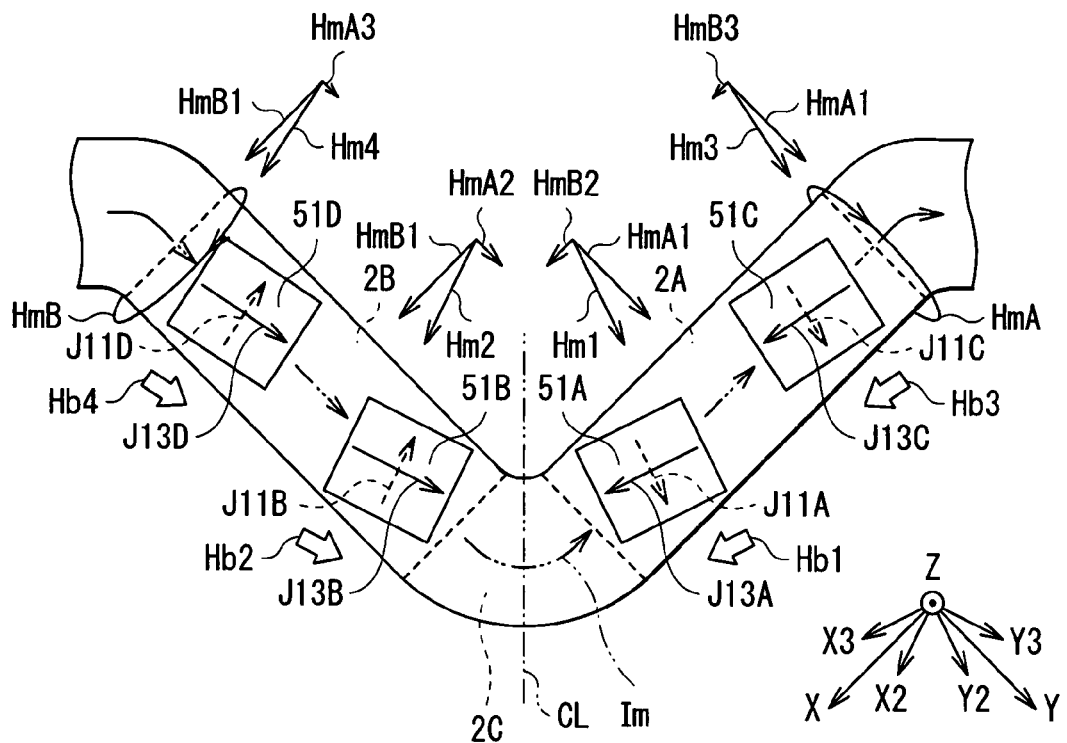
FIG. 8 is a conceptual diagram for explaining a state of magnetization directions, current magnetic fields and bias magnetic fields in a current sensor according to a third embodiment of the present invention.

FIG. 8 is a conceptual diagram showing a relation of current direction, magnetic field directions, and magnetization directions according to a current sensor of the present embodiment. As shown in FIG. 8, in the current sensor of the present embodiment, a straight-line portion 2A is provided with an MR element 51A and an MR element 51C along the extending direction of the straight-line portion 2A (in the x-axis direction). On the other hand, the straight-line portion 2B is provided with an MR element 51B and an MR element 51D along the extending direction of the straight-line portion 2B (in the y-axis direction). It is to be noted that each of the MR elements 51A to 51D is disposed on a not-illustrated supporting substrate (similar to the supporting substrate 54 shown in FIG. 3) to form an MR element layer (similar to the MR element layer 5A shown in FIG. 3). Further, a magnetic substrate (not illustrated) is disposed between each of the supporting substrates and the conductor 2 so as to apply bias magnetic fields Hb1 to Hb4 to the MR elements 51A to 51D, respectively.

For example, suppose that a current to be detected Im flows along the extending direction of the conductor 2 as shown by arrows, a current magnetic field HmA is generated around the straight-line portion 2A, and a current magnetic field HmB is generated around the straight-line portion 2B. In this case, as indicated by vectors, a synthetic magnetic field Hm1, which is a resultant force of a magnetic field component HmA1 in the +Y direction caused by the current magnetic field HmA and a magnetic field component HmB2 in the +X direction caused by the current magnetic field HmB, is applied to the MR element 51A. Similarly, a synthetic magnetic field Hm2, which is a resultant force of a magnetic field component HmA2 in the +Y direction caused by the current magnetic field HmA and a magnetic field component HmB1 in the +X direction caused by the current magnetic field HmB, is applied to the MR element 51B. To the MR element 51C, a synthetic magnetic field Hm3, which is a resultant force of the magnetic field component HmA1 in the +Y direction caused by the current magnetic field HmA and a magnetic field component HmB3 in the +X direction caused by the current magnetic field HmB, is applied. To the MR element 51D, a synthetic magnetic field Hm4, which is a resultant force of a magnetic field component HmA3 in the +Y direction caused by the current magnetic field HmA and the magnetic field component HmB1 in the +X direction caused by the current magnetic field HmB, is applied. Here, since the MR elements 51C and 51D are located in the position far from the center position CL compared with the MR elements 51A and 51B, they are less influenced by the interaction of the current magnetic field HmA and the current magnetic field HmB than the MR elements 51A and 51B. Namely, the magnetic field component HmB3 is smaller than the magnetic field component HmB2 (HmB3<HmB2), and the magnetic field component HmA3 is smaller than the magnetic field component HmA2 (HmA3<HmA2). Therefore, the synthetic magnetic field Hm3 has a direction nearer to the +Y direction than the synthetic magnetic field Hm1, and the synthetic magnetic field Hm4 has a direction nearer to the +X direction than the synthetic magnetic field Hm2.

As for the MR elements 51A and 51C, the magnetization directions J11A and J11C of the pinned layers 11 are pinned in a direction parallel to the synthetic magnetic fields Hm1 and Hm3, respectively. Namely, the magnetization directions J11A and J11C are in the forward direction relative to the direction of the current magnetic field HmA. As for the MR elements 3B and 3D, on the other hand, the magnetization directions J11B and J11D of the pinned layers 11 are pinned in antiparallel to the synthetic magnetic fields Hm2 and Hm4, respectively. Namely, the magnetic field directions J11B and J11D are in the opposite direction to the direction of the current magnetic fields HmB. Under no external magnetic field H, magnetization directions J13A and J13C of the free layers 13 is in a direction of slightly tilting to the −Y direction from +X so as to be orthogonal to the synthetic magnetic fields Hm1 and Hm3, respectively. The magnetization directions J13B and J13D are in a direction of slightly tilting to the −X direction from +Y so as to be orthogonal to the synthetic magnetic field Hm2 and Hm4, respectively. Namely, under no external magnetic field H, the magnetization directions J13A to J13D are in such a state as orthogonal to the magnetization directions J11A to J13D, respectively. Therefore, when the current to be detected Im is supplied to the conductor 2 to generate the synthetic magnetic fields Hm1 to Hm4, the magnetization directions J13A and J13C are coming to be in parallel (low resistance) to the magnetization directions J11A and J11C respectively, and the magnetization directions J13B and J13D are coming to be in antiparallel (high resistance) to the magnetization directions J11B and J11D, respectively. Therefore, resistances R1, R3 of the MR elements 51A, 51C are reduced while resistances R2, R4 of the MR elements 51B, 51D are increased.

Figure 9:
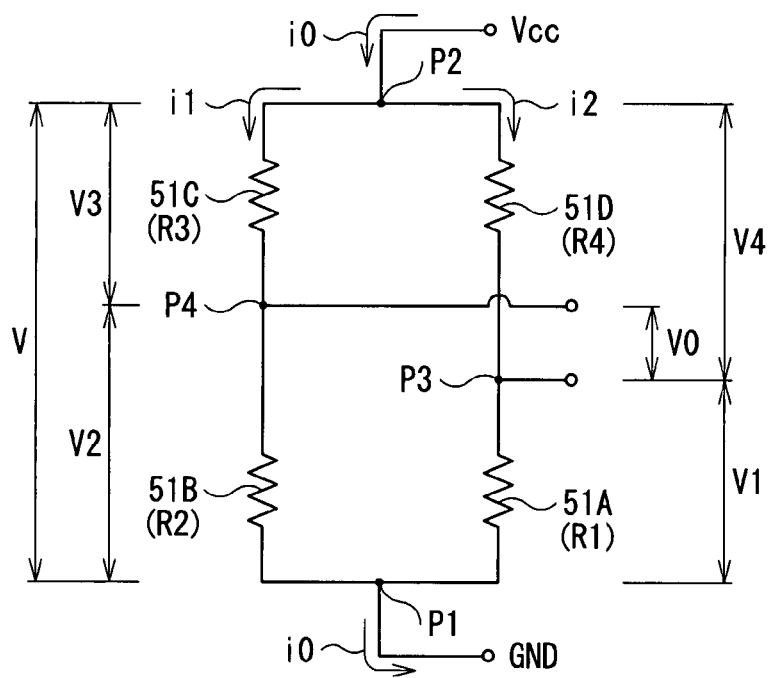
FIG. 9 is a circuit diagram corresponding to the current sensor illustrated in FIG. 8.

In the current sensor of the present embodiment, as shown in FIG. 9, one ends of the MR elements 51A and 51B are connected at a first connection point P1 while one ends of the MR elements 51C and 51D are connected at a second connection point P2, and the other end of the MR element 51A and the other end of the MR element 51D are connected each other at a third connection point P3, and the other end of the MR element 51B and the other end of the MR element 51C are connected each other at a fourth connection point P4 to form a bridge circuit. It is to be noted that FIG. 9 illustrates a circuit configuration in the current sensor of the present embodiment.

Hereafter, a method of measuring the current magnetic field Hm generated by the current to be detected Im will be explained with reference to FIG. 9.

In FIG. 9, a state where the external magnetic field H is not applied is considered first. Each resistance of the MR elements 51A to 51D upon supplying a read current $i_0$ is taken as "r1 to r4". The read current $i_0$ flowing from a power supply Vcc is split into two, a read current $i_1$ and a read current $i_2$, at the second connection point P2. Then, the read current $i_1$ which flows through the MR element 51C and the MR element 51B, and the read current $i_2$ which flows through the MR element 51D and the MR element 51A join at the first connection point P1. In this case, potential difference V between the second connection point P2 and the first connection point P1 is expressed as follows:

$$V = i_1 r3 + i_1 r2 = i_2 r4 + i_2 r1 = i_1 (r3 + r2) = i_2 (r4 + r1) \quad (4)$$

Potential V3 at the fourth connection point P4, and potential V4 at the third connection point P3 can be respectively expressed as follows:

$$V3 = V - i_1 r3$$

$$V4 = V - i_2 r4.$$

Therefore, potential difference V0 of the fourth connection point P4 and the third connection point P3 can be expressed as follows:

$$V0 = V4 - V3 = (V - i_2 r4) - (V - i_1 r3) = i_1 r3 - i_2 r4 \quad (5)$$

Here, it can be rewritten in view of the equation (4) as follows:

$$V0 = r3/(r3 + r2) \times V - r4/(r4 + r1) \times V = \{r3/(r3 + r2) - r4/(r4 + r1)\} \times V \quad (6)$$

In this bridge circuit, resistance variation amount can be obtained by measuring the potential difference V0 between the fourth connection point P4 and the third connection point P3 as expressed with the above-mentioned equation (6) when the current magnetic field Hm which is an external magnetic field is applied. Here, supposing that the resistances R1 to R4 has been increased by variations ΔR1 to ΔR4 respectively when the current magnetic field Hm is applied, namely, the resistances R1 to R4 after applying the current magnetic field Hm are as follows respectively, $R1 = r1 + \Delta R1$ $R2 = r2 + \Delta R2$ $R3 = r3 + \Delta R3$ $R4 = r4 + \Delta R4,$ the potential difference V0 at the time of the application of the current magnetic field Hm can be expressed as follows in view of the equation (6):

$$V0 = \{(r3+\Delta R3)/(r3+\Delta R3+r2+\Delta R2) - (r4+\Delta R4)/(r4+\Delta R4+r1+\Delta R1)\} \times V \quad (7).$$

Since the current sensor is configured so as to develop an opposite-directional variation each other between the resistances R1, R3 of the MR elements 51A, 51C and the resistances R2, R4 of the MR elements 51B, 51D, variation amounts ΔR4 and ΔR1 thereby cancel out each other while variation amounts ΔR3 and ΔR2 cancel out each other. For this reason, in comparing values before/after the application of the current magnetic field Hm, the denominator value in each of the terms is scarcely increased in the equation (7). On the other hand, the numerator value in each of the term is either increased or decreased since variation ΔR3 and variation ΔR1 have mutually-opposite positive/negative signs without fail.

Supposing that all of the MR elements 51A to 51D have completely-common characteristics, namely, when it is r1=r2=r3=r4=R and ΔR1=−ΔR2=ΔR3=−ΔR4=ΔR, Equation (7) is expressed as follow:

$$V0 = \{(R + \Delta R)/(2 \times R) - (R \cdot \Delta R)/(2 \times R)\} \times V = (\Delta R/R) \times V$$

As described above, the intensity of the current magnetic field Hm can be measured by using the MR elements 51A to 51D, whose characteristic values such as ΔR/R are given, thereby the magnitude of current to be detected Im, which generates the current magnetic field Hm, can be estimated. In particularly, since sensing is performed by using the four MR elements 51A to 51D, measurement with higher precision can be realized compared with a case where sensing is performed by using only two MR elements 51A and 51B.

Although the present embodiment explains a case of using the conductor 2 of V-shaped configuration (in plan view), the present invention is not limited to this and it is also possible to arrange the four MR elements 51A to 51D along the straight-line conductor 21 as described in the second embodiment for example.

EXAMPLE

Next, an example of the present invention will be explained hereinbelow.

Here, variation of resistance R was measured at first, when a magnetic field Hy having a flux density By was applied to the MR element 51A in the direction along the magnetization directions J11A of the pinned layer 11 (namely, in the +Y2 direction) as shown in FIG. 6A. It was decided that bias magnetic field Hb1 within the range of 0 to $50 \times 10^{-4}$ T (tesla) was also applied at that time. The result is shown in FIGS. 10 to 15. Here, as for the magnetic substrate 4A, the planar dimension was taken as 0.26 mm×0.37 mm, the thickness as 45 μm-95 μm, and saturation magnetization was taken as 2200 A/m.

Structure of the element patterns 52 and 53 in the MR element 51A was as follows: nickel iron alloy (NiFe) of 0.3; cobalt iron alloy (CoFe) of 1.0; copper (Cu) of 1.8; CoFe of 2.5; ruthenium (Ru) of 0.8; CoFe of 1.5; platinum manganese alloy (PtMn) of 15.0; and tantalum (Ta) of 3.0. Here, "NiFe of 0.3; CoFe of 1.0" represents the free layer 13 of a two-layered structure, "Copper (Cu) of 1.8" represents the intermediate layer 12, "CoFe of 2.5; Ru of 0.8; CoFe of 1.5" represents the magnetization pinning film 14 of a three-layered structure, "PtMn of 15.0" represents the antiferromagnetic film 15, and "tantalum of 3.0" represents the protective film 16. It is to be noted that the numerals indicated at the ends of the constituent names represent a thickness (nm) of their respective layers. The plan view of the element patterns 52 and 53 was taken as 2 μm in width and 180 μm in length. The magnitude of the flux density Bb1 was made adjustable by changing the thickness of the magnetic substrate 4A and the distance between the magnetic substrate 4A and the MR element 51A.

Figure 10:
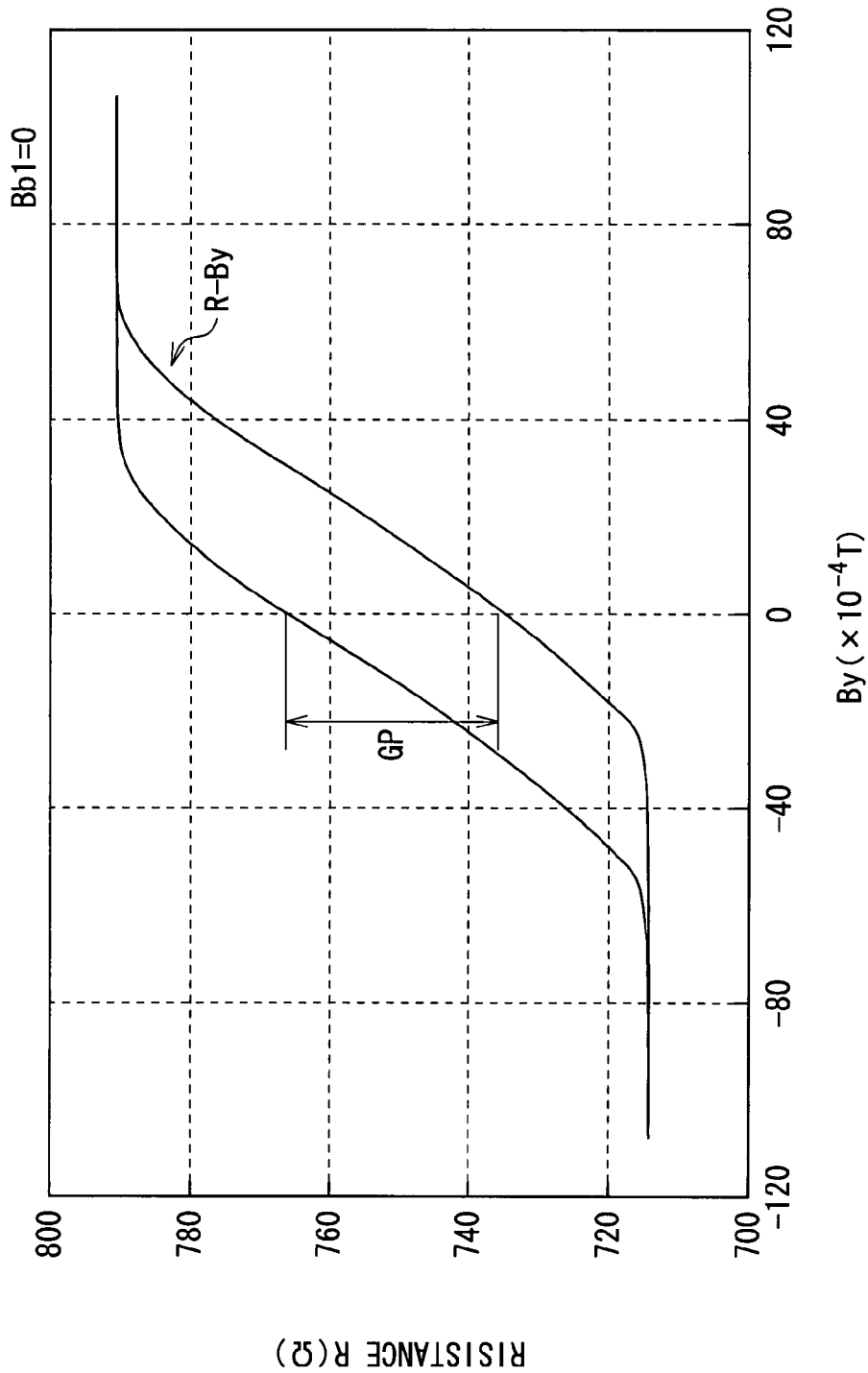
FIG. 10 is a first characteristic diagram showing magnetic field dependency of resistance R in the magnetoresistive element of the magnetic sensor illustrated in FIG. 2.
Figure 11:
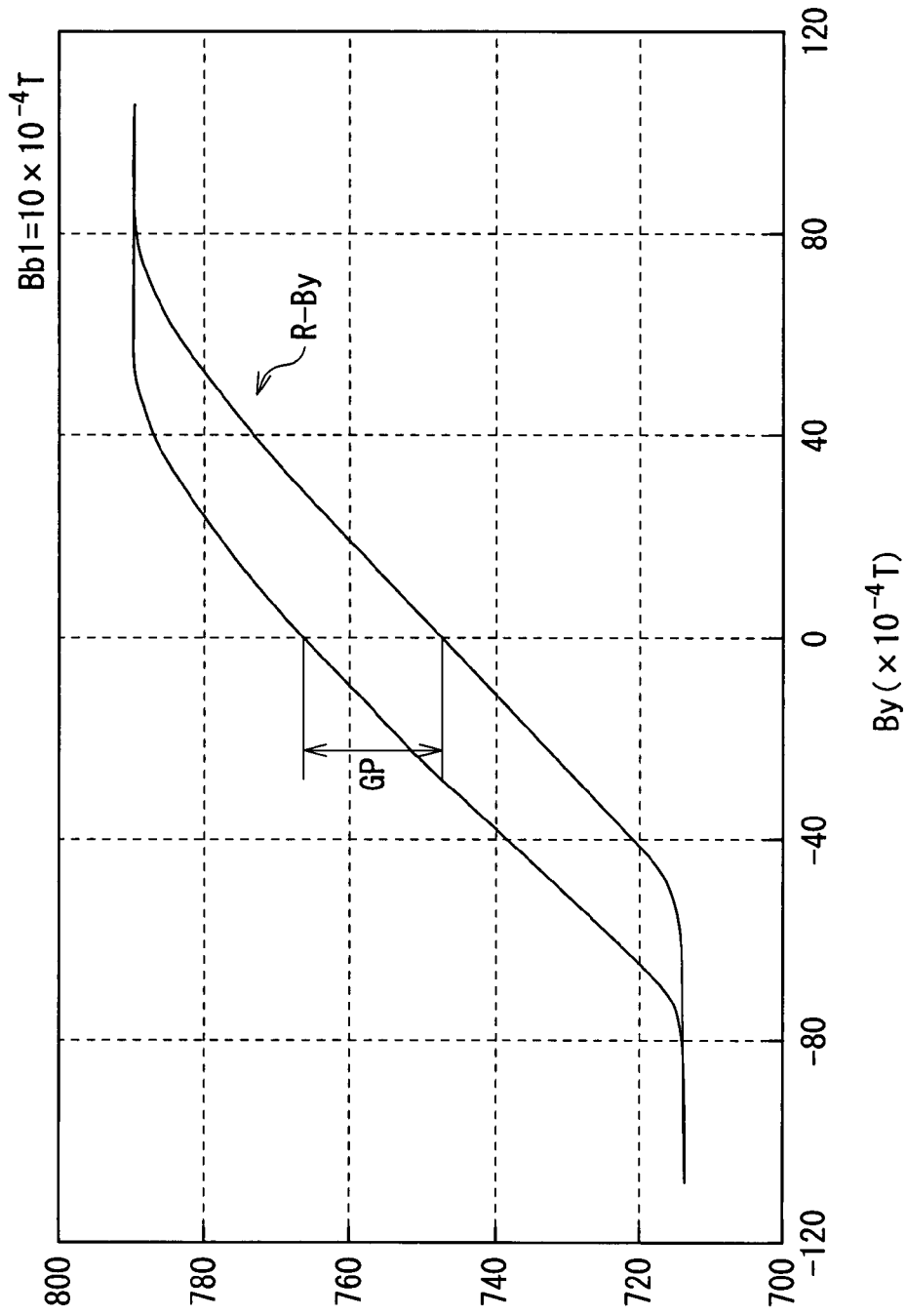
FIG. 11 is a second characteristic diagram showing magnetic field dependency of resistance R in the magnetoresistive element of the magnetic sensor illustrated in FIG. 2.
Figure 12:
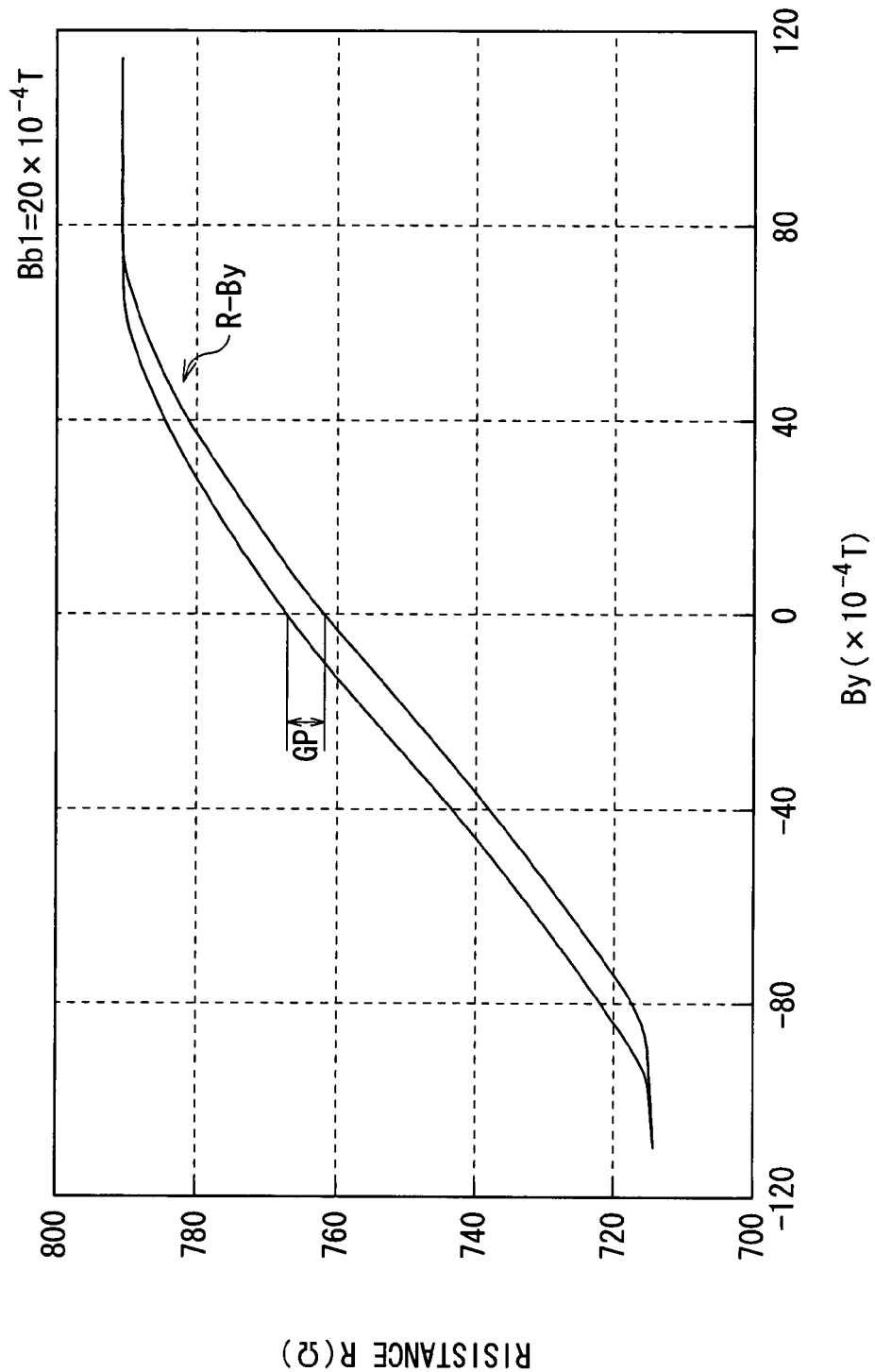
FIG. 12 is a third characteristic diagram showing magnetic field dependency of resistance R in the magnetoresistive element of the magnetic sensor illustrated in FIG. 2.
Figure 13:
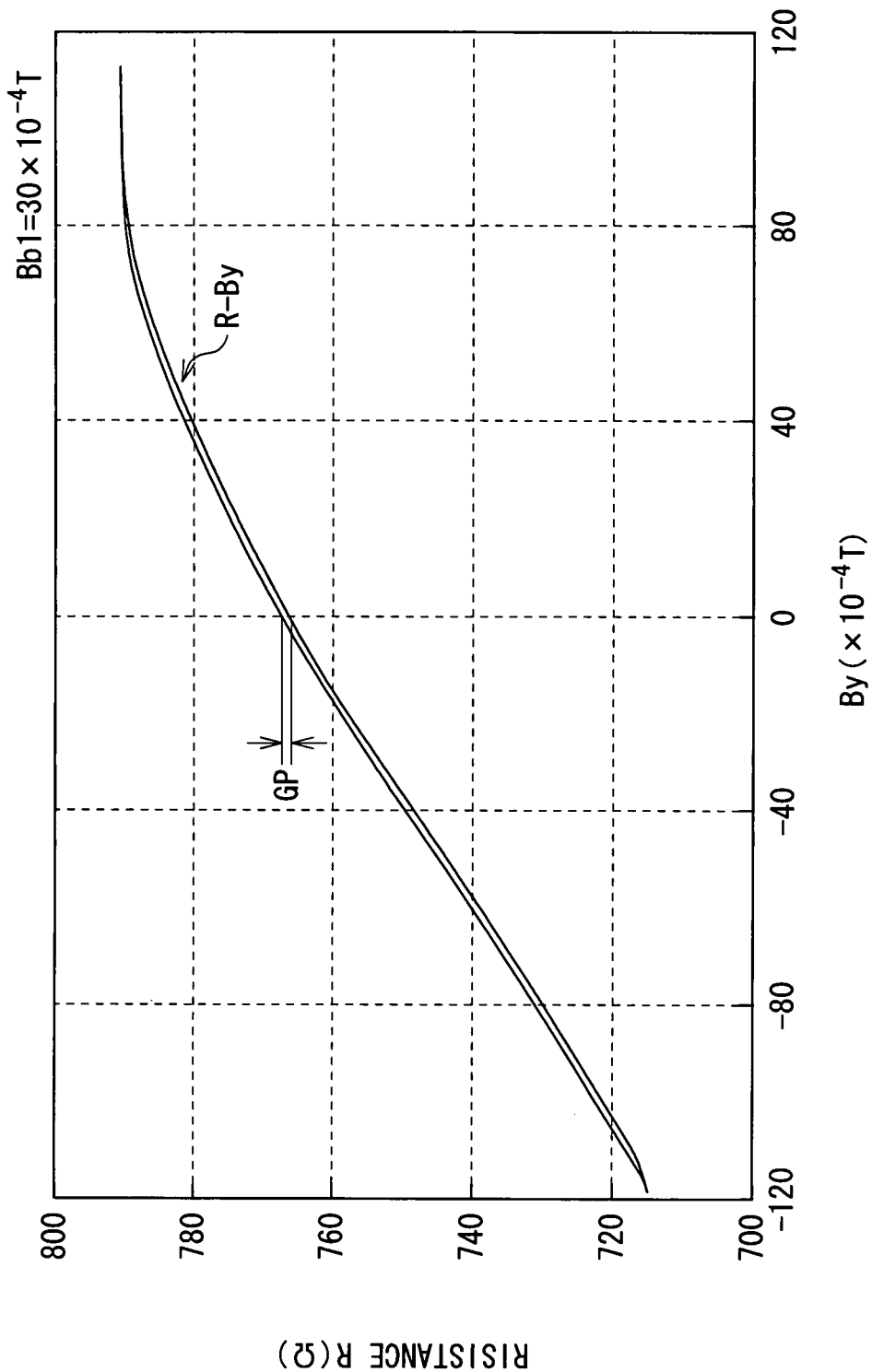
FIG. 13 is a fourth characteristic diagram showing magnetic field dependency of resistance R in the magnetoresistive element of the magnetic sensor illustrated in FIG. 2.
Figure 14:
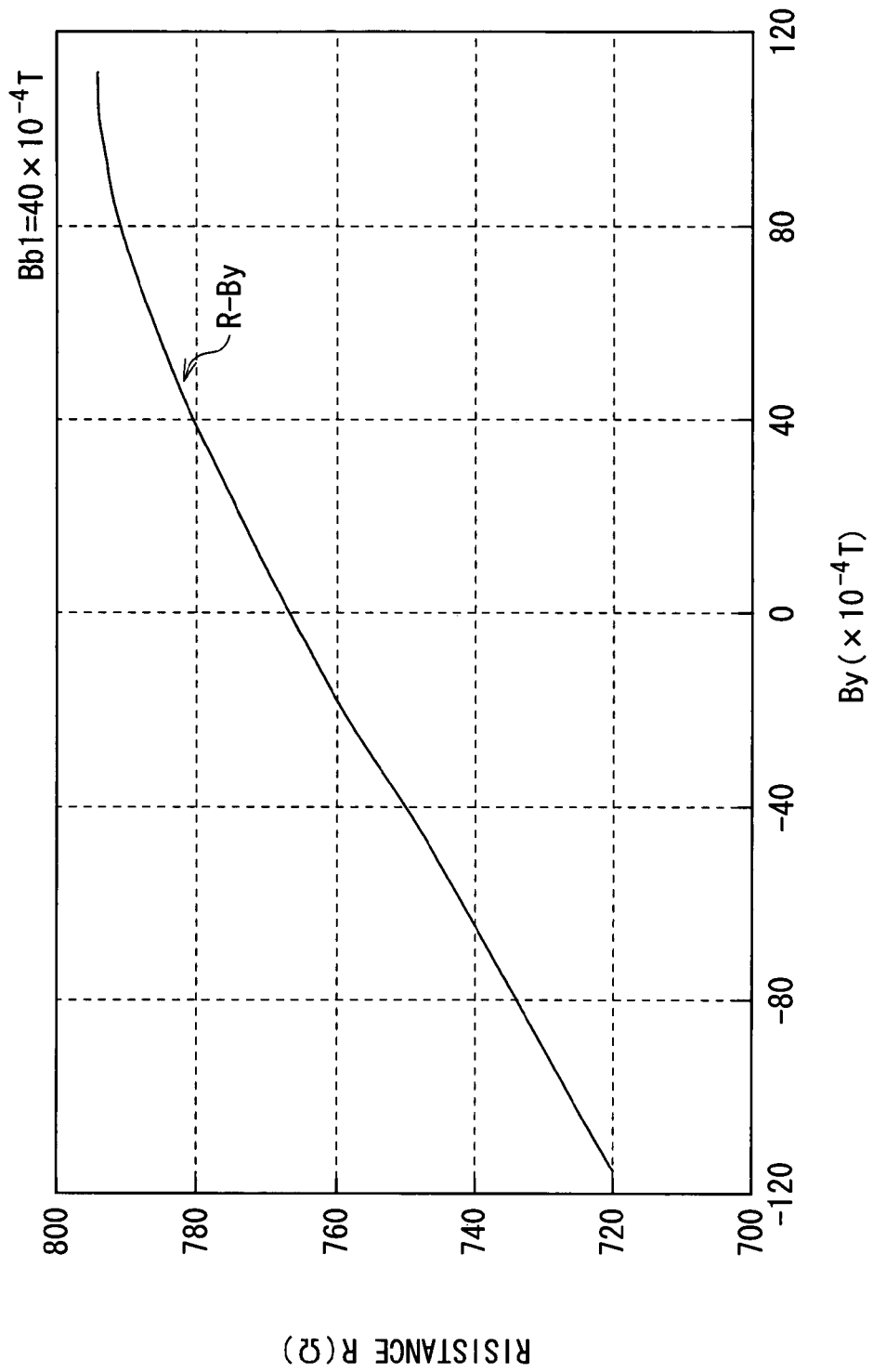
FIG. 14 is a fifth characteristic diagram showing magnetic field dependency of resistance R in the magnetoresistive element of the magnetic sensor illustrated in FIG. 2.
Figure 15:
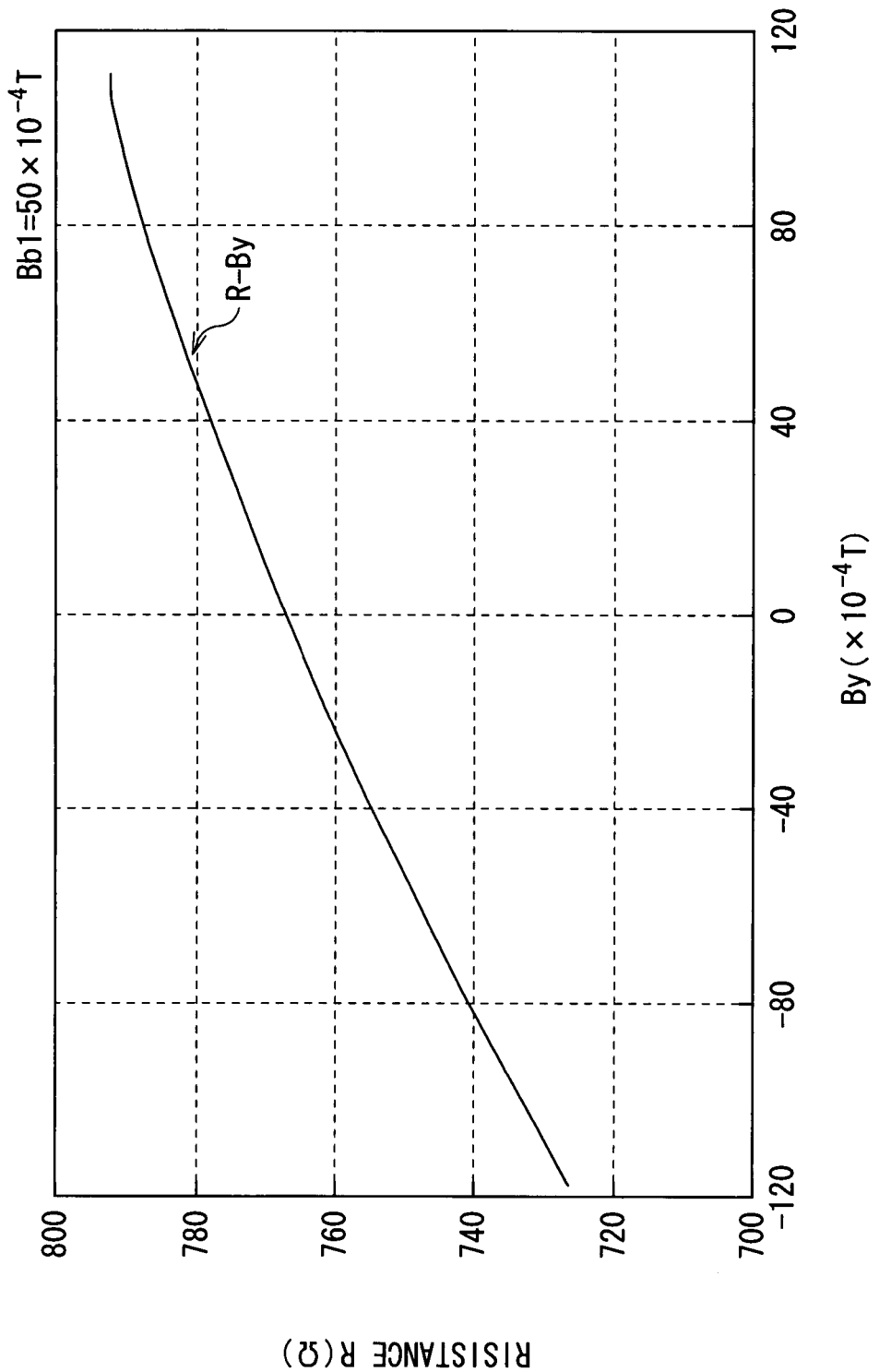
FIG. 15 is a sixth characteristic diagram showing magnetic field dependency of resistance R in the magnetoresistive element of the magnetic sensor illustrated in FIG. 2.

In any of FIGS. 10 to 15, the horizontal axis represents the flux density By, and the vertical axis represents the resistance R. Each of the graphs shows a degree of dependency of the resistance R on the flux density by way of the curved line R-By. FIG. 10 shows a result when the flux density Bb1 of the bias magnetic field Hb1 was taken as $0 \times 10^{-4}$ T, respectively. Similarly, FIGS. 11, 12, 13, 14, and 15 show results corresponding to cases when the flux density Bb1 of the bias magnetic field Hb1 are taken as $10 \times 10^{-4}$ T, $20 \times 10^{-4}$ T, $30 \times 10^{-4}$ T, $40 \times 10^{-4}$ T, and $50 \times 10^{-4}$ T, respectively.

In any cases, as shown by FIGS. 10 to 15, resistance R developed hysteresis corresponding to the variation of flux density By. Here, the difference of resistance values (hysteresis gap GP) under zero flux density By decreases as the flux density Bb1 of the bias magnetic field Hb1 is strengthened.

Figure 16:
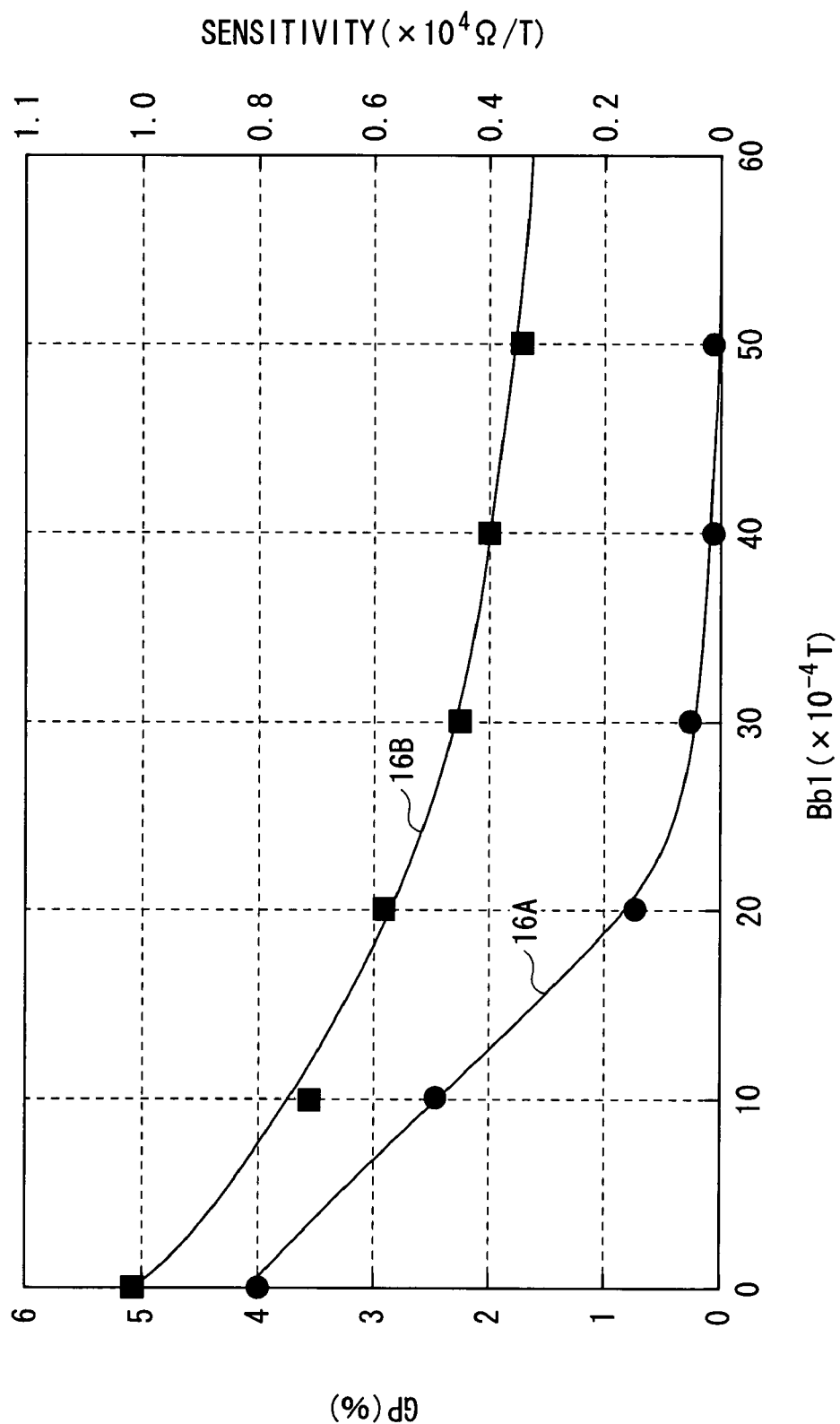
FIG. 16 is a characteristic diagram showing a relation between hysteresis gap GP or sensitivity in the magnetoresistive element of the magnetic sensor shown in FIG. 2, and flux density of a bias magnetic field.

Based on the results of FIGS. 10 to 15, FIG. 16 shows a variation of the hysteresis gap GP with respect to values of the bias magnetic field Hb1 as a curved line 16A. Although sensitivity is additionally indicated in FIG. 16, it will be described later. In FIG. 16, the horizontal axis represents the flux density Bb1 of the bias magnetic field Hb1 ($\times 10^{-4}$ T), and the vertical axis (left side) represents the hysteresis gap GP (%) corresponding to FIGS. 10 to 15. Here, the hysteresis gap GP was calculated by dividing the difference of resistance R (Ω) under no flux density By by 750 (Ω), which is a central value of the variation values. The magnitude of exchange bias magnetic field Hin was taken as zero. As a result, as shown by FIG. 16, it was known that the hysteresis gap GP can be sufficiently reduced if the flux density Bb1 was $20 \times 10^{-4}$ T or more, without any noise that may cause any practical problems, thereby realizing the sensing with high sensitivity and stability.

FIG. 16 additionally shows a variation of sensitivity of the MR element 51A as a curved line 16B. "Sensitivity" here is a resistance change ratio of the MR element 51A, which is equivalent to the inclination of the curved line R-By shown in FIGS. 10 to 15 under no flux density By. The vertical axis on the right side of the drawing sheet represents the sensitivity ($\times 10^4$ $\Omega$/T) to be derived from FIGS. 10 to 15. Sensitivity here is a value available in a case where the magnetic sensor 3A is capable of measuring the magnetic field Hy having the flux density By within the range of $0\pm 10\times 10^{-4}$ T. Namely, the curved line 16B of FIG. 16 expresses a variation of sensitivity in a case where the flux density of the magnetic fields Hd1, Hd2 generated by the compensation current line C included in the magnetic sensor 3A is set within a full-scale range of $0\pm 10\times 10^{-4}$ T. As a result, although sensitivity tends to be reduced as the flux density Bb1 increases, it proved that this change was not so radical as to cause any practical problems.

Figure 17:
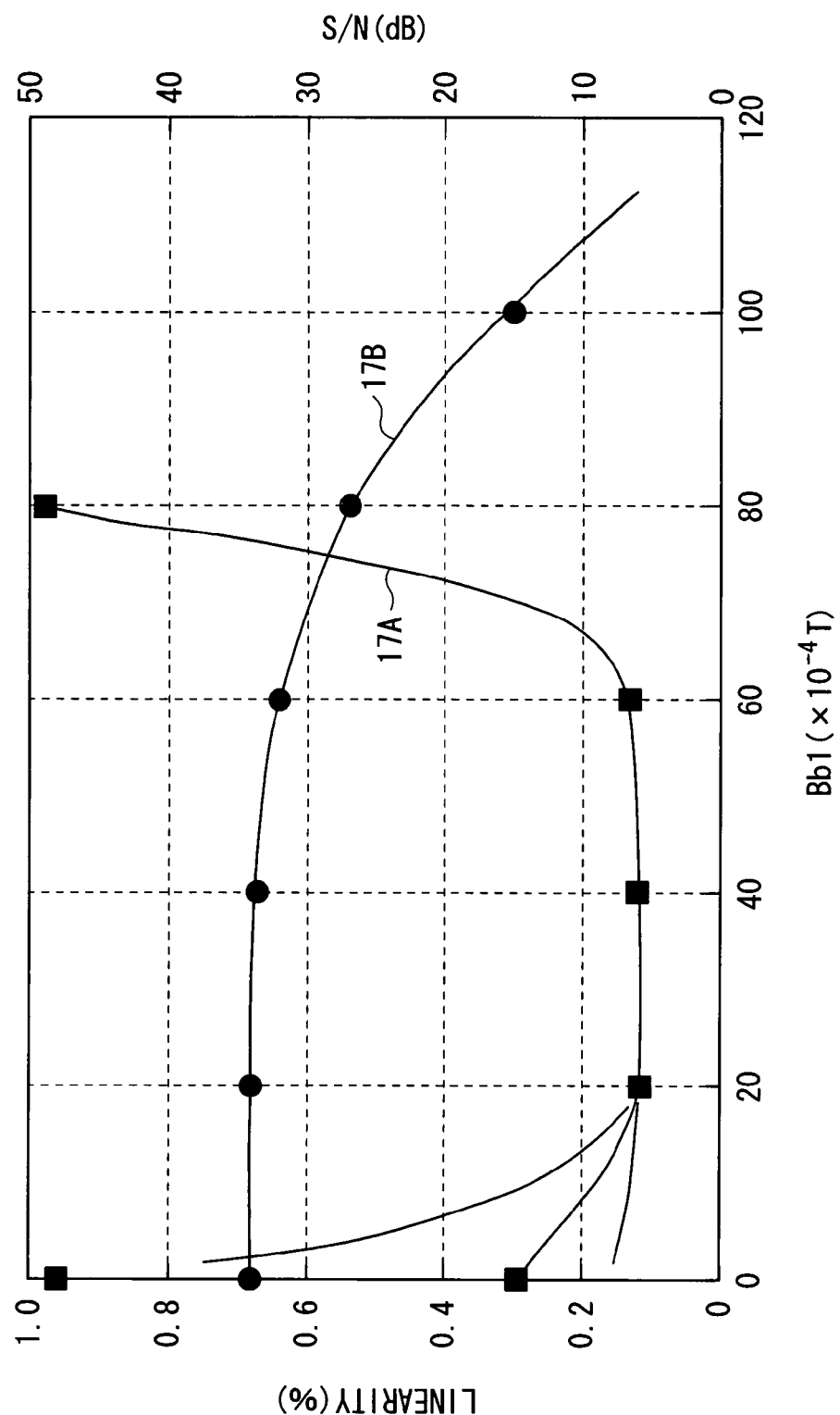
FIG. 17 is a characteristic diagram showing a relation between linearity or S/N ratio in the magnetoresistive element of the magnetic sensor shown in FIG. 2, and flux density of the bias magnetic field.

Curved line 17A of FIG. 17 shows a relation between linearity of the compensation current Id (as shown in the current circuit appearing in FIG. 4) and the flux density Bb1. Specifically, linearity is expressed by the following equation:

$$(\text{Linearity \%}) = [(Im - m \times Id)/Im(\max)]\max \qquad (8).$$

Here, Im represents current to be detected, Im (max) represents the maximum current to be detected, and m is a constant of proportion expressed by "Im (max)/Id". In FIG. 17, the horizontal axis represents the flux density Bb1 ($\times 10^{-4}$ T), and the vertical axis (left side of the drawing sheet) represents the linearity (%) that can be calculated by Equation (8). In view of transition of the varying curved line 17A, it was proved that the linearity was rapidly deteriorated in a case where a value of the flux density Bb1 went beyond $60\times 10^{-4}$ T, while became susceptible to unnecessary (undesirable) effects of external magnetic fields in a case where the flux density Bb1 was so weak as less than $20\times 10^{-4}$ T. Namely, if the value of the flux density Bb1 is within the range of $20\times 10^{-4}$ T to $60\times 10^{-4}$ T, linearity with stabilized characteristics is obtainable.

A curved line 17B of FIG. 17 also shows S/N ratio for the magnetic sensor 3A. The S/N ratio here is a value in a case where the magnetic sensor 3A can measure a magnetic field Hy having the flux density By of the range $0\pm 10\times 10^{-4}$ T. Namely, the curved line 17B of FIG. 17 expresses variation of the S/N ratio in the case the flux density of the magnetic fields Hd1, Hd2 generated by the compensation current line C in the magnetic sensor 3A is set within a full-scale range of $0\pm 10\times 10^{-4}$ T. The vertical axis on the right side of the drawing sheet represents the S/N ratio. In view of transition of the curved line 17B, it was confirmed that the S/N ratio is stabilized if the flux density Bb was $60\times 10^{-4}$ T or less.

As mentioned above, although the present invention has been explained with reference to some embodiments and examples, the present invention is not limited to the above-mentioned embodiments etc, and various kinds of modifications are available. For example, in the present embodiments, although a magnetic substrate as bias means is provided between a conductor and a magnetoresistive element, it is not limited to that. For example, a magnetoresistive element may be provided between a conductor and a magnetic substrate.

Further, although the foregoing embodiments are explained by taking as an example the current sensor that measures current magnetic fields generated by currents flowing through a conductor, the present invention is not limited to this. The present invention also includes the magnetic sensor that can detect a change of magnetic flux itself in an environment where the magnetic sensor is located even without a conductor for flowing currents. The magnetic sensor of the present invention is applicable to the eddy current inspection technique for conducting inspection of a defect of printed wiring etc., for example. In this case, a plurality of magnetoresistive elements is arranged linearly on an object to be inspected so that a change in eddy currents can be regarded as a change in the magnetic flux.

It should be understood by those skilled in the art that various modifications, combinations, sub-combinations and alternations may occur depending on design requirements and other factors insofar as they are within the scope of the appended claims or the equivalents thereof.

What is claimed is:

1. A current sensor comprising:
   a conductor generating a current magnetic field in accordance with supplied current to be detected;
   a magnetoresistive element including a free layer having a magnetization direction that varies in accordance with the current magnetic field, a pinned layer having a magnetization direction that is pinned to a direction orthogonal to the magnetization direction of the free layer under no current magnetic field, and an intermediate layer provided between the free layer and the pinned layer; and
   a permanent magnet for applying, to the magnetoresistive element so as to reach the entire magnetoresistive element, a bias magnetic field having a constant intensity along a direction same with the magnetization direction of the free layer under no current magnetic field.

2. The current sensor according to claim 1, wherein the free layer has an easy magnetization axis which is parallel to the magnetization direction of the free layer itself under no current magnetic field.

3. The current sensor according to claim 1, wherein flux density of the bias magnetic field is within a range of $20\times 10^{-4}$ tesla (T) to $60\times 10^{-4}$ tesla (T).

4. The current sensor according to claim 1, wherein the permanent magnet is extended along the magnetoresistive element.

5. A current sensor comprising:
   a conductor generating a current magnetic field in accordance with supplied current to be detected;
   a first and a second magnetoresistive elements each including a free layer having a magnetization direction that varies in accordance with the current magnetic field, a pinned layer having a magnetization direction that is pinned to a direction orthogonal to the magnetization direction of the free layer under no current magnetic field, and an intermediate layer provided between the free layer and the pinned layer;
   a first permanent magnet for applying, to the first magnetoresistive element so as to reach the entire first magnetoresistive element, a bias magnetic field having a constant intensity along a direction same with the magnetization direction of the free layer of the first magnetoresistive element under no current magnetic field;
   a second permanent magnet for applying, to the second magnetoresistive element so as to reach the entire second magnetoresistive element, a bias magnetic field having a constant intensity along a direction same with the magnetization direction of the free layer of the second magnetoresistive element under no current magnetic field;

a first and a second constant current sources supplying constant currents of a common value to the first and the second magnetoresistive elements, respectively; and a differential detector detecting a difference of voltage drops produced in the first and the second magnetoresistive elements according to each of the constant currents, wherein the current to be detected are detected based on the difference of voltage drops.

6. The current sensor according to claim 5, wherein one end of the first magnetoresistive element and one end of the second magnetoresistive element are connected at a first connection point;

one end of the first constant current source and one end of second constant current source are connected at a second connection point;

the other end of the first magnetoresistive element and the other end of the first constant current source are connected at a third connection point;

the other end of the second magnetoresistive element and the other end of the second constant current source are connected at a fourth connection point; and the current to be detected is detected based on the potential difference between the third connection point and the fourth connection point produced when a voltage is applied between the first connection point and the second connection point.

7. The current sensor according to claim 5, further comprising a compensation current line through which a compensation current flows in accordance with the difference of voltage drops, wherein the compensation current generates a couple of compensation current magnetic fields each of which is along a direction opposite to that of each of the current magnetic fields applied to the first and the second magnetoresistive elements based on the current to be detected, and the couple of compensation current magnetic fields are applied to the first and the second magnetoresistive elements, respectively.

8. The current sensor according to claim 7, wherein the current to be detected is detected based on the compensation current.

9. The current sensor according to claim 5, wherein the pinned layer of one of the first and the second magnetoresistive elements has a magnetization direction of the forward direction relative to that of the current magnetic field, and the pinned layer of the other magnetoresistive element has a magnetization direction of the opposite direction to that of the current magnetic field.

10. The current sensor according to claim 5, wherein the first and the second permanent magnets are extended along the first and the second magnetoresistive elements respectively.

11. The current sensor according to claim 5, wherein the free layer has an easy magnetization axis which is parallel to the magnetization direction of the free layer itself under no current magnetic field.

12. The current sensor according to claim 5, wherein flux density of the bias magnetic field is within a range of $20 \times 10^{-4}$ tesla (T) to $60 \times 10^{-4}$ tesla (T).

* * * * *